US012690255B2

(12) United States Patent
Park et al.

(10) Patent No.: US 12,690,255 B2
(45) Date of Patent: Jul. 21, 2026

(54) SEMICONDUCTOR DEVICE SIDEWALL OF THE GATE SEMICONDUCTOR LAYER INCLUDING A PLURALITY OF SURFACES HAVING DIFFERENT SLOPES

(71) Applicant: Samsung Electronics Co., Ltd., Suwon-si (KR)

(72) Inventors: Junhyuk Park, Suwon-si (KR); Jaejoon Oh, Suwon-si (KR); Sunkyu Hwang, Suwon-si (KR); Boram Kim, Suwon-si (KR); Jongseob Kim, Suwon-si (KR); Joonyong Kim, Suwon-si (KR); Injun Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 496 days.

(21) Appl. No.: 18/193,859

(22) Filed: Mar. 31, 2023

(65) Prior Publication Data

US 2024/0113184 A1     Apr. 4, 2024

(30) Foreign Application Priority Data

Oct. 4, 2022     (KR) ........................ 10-2022-0126589

(51) Int. Cl.
H10D 64/27          (2025.01)
H10D 30/01          (2025.01)
(Continued)

(52) U.S. Cl.
CPC ......... H10D 64/411 (2025.01); H10D 30/015 (2025.01); H10D 30/475 (2025.01); H10D 62/8503 (2025.01); H10D 64/01 (2025.01)

(58) Field of Classification Search
CPC ......... H10D 30/47–485; H10D 30/015; H10D 62/00; H10D 64/00; H10D 64/411;
(Continued)

(56) References Cited

U.S. PATENT DOCUMENTS 6,060,402 A * 5/2000 Hanson ................ H10D 30/015
257/E21.407
6,180,968 B1 * 1/2001 Kasahara ............. H10D 30/015
257/E21.407

(Continued)

FOREIGN PATENT DOCUMENTS

KR      2015-0100574 A      9/2015

OTHER PUBLICATIONS

Extended European Search Report dated Mar. 5, 2024 for corresponding European Patent Application No. 23172284.4.
(Continued)

*Primary Examiner* — Maliheh Malek
(74) *Attorney, Agent, or Firm* — Harness, Dickey & Pierce, P.L.C.

(57) ABSTRACT

A semiconductor device may include a barrier layer on a channel layer, a gate electrode on the barrier layer, a gate semiconductor layer between the barrier layer and the gate electrode, and a source and a drain spaced apart from each other on the channel layer. The barrier layer may have a greater energy band gap than the channel layer. The gate semiconductor layer may include a first surface contacting the barrier layer and a second surface contacting the gate electrode, and a sidewall connecting the first surface with the second surface. An area of the second surface of the gate semiconductor layer may be narrower than an area of the first surface. The sidewall of the gate semiconductor layer may include a plurality of surfaces having different slopes.

20 Claims, 14 Drawing Sheets

(51) Int. Cl.
H10D 30/47 (2025.01)
H10D 62/85 (2025.01)
H10D 64/01 (2025.01)

(58) Field of Classification Search
CPC .. H10D 30/475; H10D 62/8503; H10D 64/01; H10D 62/343; H10D 30/4755
See application file for complete search history.

(56) References Cited

U.S. PATENT DOCUMENTS

| | | | | |
|---|---|---|---|---|
| 6,307,221 | B1 * | 10/2001 | Danzilio | H10D 30/4755 438/168 |
| 7,012,286 | B2 * | 3/2006 | Inai | H10D 64/411 257/E29.127 |
| 7,199,014 | B2 * | 4/2007 | Anda | H10D 30/015 438/285 |
| 7,915,643 | B2 * | 3/2011 | Suh | H10D 30/015 257/E29.247 |
| 8,043,906 | B2 * | 10/2011 | Beach | H10D 30/015 257/E21.409 |
| 8,841,154 | B2 * | 9/2014 | Yoon | H10D 64/0125 257/E21.205 |
| 8,860,088 | B2 * | 10/2014 | Yu | H10D 30/015 257/E29.252 |
| 9,281,204 | B2 * | 3/2016 | Moore | H10D 64/0125 |
| 10,243,070 | B2 * | 3/2019 | Miyamoto | H10D 30/4755 |
| 2011/0127604 | A1 * | 6/2011 | Sato | H10D 64/411 257/E29.252 |
| 2011/0147797 | A1 * | 6/2011 | Boles | H10D 30/4755 257/E21.403 |
| 2014/0209922 | A1 * | 7/2014 | Ota | H10D 64/111 257/194 |
| 2014/0291774 | A1 * | 10/2014 | Nishi | H10D 30/4755 257/410 |
| 2016/0035847 | A1 | 2/2016 | Cao et al. | |
| 2017/0317179 | A1 * | 11/2017 | Cao | H10D 30/015 |
| 2019/0244823 | A1 * | 8/2019 | Yoshida | H10D 30/4755 |
| 2019/0267481 | A1 * | 8/2019 | Ramu | H10D 30/015 |
| 2021/0151592 | A1 * | 5/2021 | Lee | H10D 30/475 |
| 2021/0399123 | A1 * | 12/2021 | Liao | H10D 30/015 |
| 2021/0399124 | A1 * | 12/2021 | Liao | H10D 64/112 |
| 2022/0109056 | A1 * | 4/2022 | Liao | H10D 30/475 |
| 2022/0238422 | A1 * | 7/2022 | Nikitin | H10W 40/778 |
| 2022/0319840 | A1 * | 10/2022 | Patel | H10P 50/73 |
| 2023/0238318 | A1 * | 7/2023 | Guan | H10B 61/22 257/421 |
| 2023/0395695 | A1 * | 12/2023 | Hardiman | H10D 30/015 |
| 2023/0411506 | A1 * | 12/2023 | Okita | H10D 30/475 |
| 2024/0030309 | A1 * | 1/2024 | Hao | H10D 30/015 |
| 2024/0120425 | A1 * | 4/2024 | Yoshioka | H10F 77/147 |
| 2024/0332361 | A1 * | 10/2024 | Ide | H10D 62/161 |
| 2025/0191913 | A1 * | 6/2025 | Aoki | H10P 14/3258 |

OTHER PUBLICATIONS

Stephen Russell "The EPC 2152 . A Fully Integrated GaN Half-Bridge IC" Tech Insights (available online on May 5, 2022 according to https://web.archive.org/web/20220505151518/https://www.techinsights.com/blog/epc-2152-fully-integrated-gan-half-bridge-ic).

Li Zhang et al, "p-GaN Gate HEMT with surface reinforcement for Enhanced gate reliabilit", IEEE Electron Device Letters, 2020.

* cited by examiner

SEMICONDUCTOR DEVICE SIDEWALL OF THE GATE SEMICONDUCTOR LAYER INCLUDING A PLURALITY OF SURFACES HAVING DIFFERENT SLOPES

CROSS-REFERENCE TO RELATED APPLICATION

This application is based on and claims priority under 35 U.S.C. § 119 to Korean Patent Application No. 10-2022-0126589, filed on Oct. 4, 2022 in the Korean Intellectual Property Office, the disclosure of which is incorporated by reference herein in its entirety.

BACKGROUND

1. Field

The present disclosure relates to a semiconductor device and a method of manufacturing the same.

2. Description of the Related Art

Various power conversion systems may require devices that control the flow of current through on/off switching, that is, power devices. In a power conversion system, the efficiency of the power device may determine the efficiency of the entire system.

As a switching device, a metal oxide semiconductor field effect transistor (MOSFET) or an insulated gate bipolar transistor (IGBT) using silicon is mainly used, but there is a limitation in increasing the efficiency of the switching device due to a material limitation of the silicon itself. In an attempt to escape the material limitation of silicon, research on a high electron mobility transistor (HEMT) using a heterojunction structure of a compound semiconductor has been actively conducted.

SUMMARY

Provided is a semiconductor device that may be used as a switching device with improved efficiency.

Provided is a method of manufacturing the semiconductor device.

Additional aspects will be set forth in part in the description which follows and, in part, will be apparent from the description, or may be learned by practice of the presented embodiments of the disclosure.

According to an embodiment, a semiconductor device may include a channel layer; a barrier layer on the channel layer, an energy band gap of the barrier layer being greater than an energy band gap of the channel layer; a gate electrode on the barrier layer; a gate semiconductor layer between the barrier layer and the gate electrode; and a source and a drain on the channel layer and spaced apart from each other. The gate semiconductor layer may include a first surface contacting the barrier layer, a second surface contacting the gate electrode, and a sidewall connecting the first surface with the second surface. An area of the second surface of the gate semiconductor layer may be narrower than an area of the first surface of the gate semiconductor layer. The sidewall of the gate semiconductor layer may include a plurality of surfaces having different slopes.

In some embodiments, the plurality of surfaces may include a first inclined surface and a second inclined surface. The first inclined surface may contact the first surface of the gate semiconductor layer at a first angle. The second inclined surface may contact the second surface of the gate semiconductor layer at a second angle. The first angle may be less than the second angle.

In some embodiments, the first angle may be 40° or less.

In some embodiments, the second angle may be greater than or equal to about 60° and less than or equal to about 90°.

In some embodiments, an angle formed by the plurality of surfaces and the first surface may decrease as positions of the plurality of surfaces become closer to the first surface.

In some embodiments, the first surface of the gate semiconductor layer and the second surface of the gate semiconductor layer may be apart from each other in a height direction. In the height direction, a height of the sidewall of the gate semiconductor layer is may be greater than or equal to about 2 nm and less than or equal to about 200 nm.

In some embodiments, the first surface of the gate semiconductor layer and the second surface of the gate semiconductor layer may be apart from each other in a height direction. In the height direction, a height of each of the plurality of surfaces may be greater than or equal to about 1 nm and less than or equal to about 100 nm.

In some embodiments, at least one of the plurality of surfaces may include a curved surface.

In some embodiments, the plurality of surfaces may form a concave curved surface.

In some embodiments, the channel layer may include a group III-V compound semiconductor.

In some embodiments, the gate semiconductor layer may include p-type GaN.

In some embodiments, the semiconductor device may be a high electron mobility transistor (HEMT) having a normally off property.

According to an embodiment, a method of manufacturing a semiconductor device may include sequentially forming a channel layer, a barrier layer, and a gate semiconductor layer on a substrate; etching the gate semiconductor layer to have a shape in which an area of a first surface of the gate semiconductor layer is wider than an area of a second surface of the gate semiconductor layer, the first surface of the gate semiconductor layer being in contact with the barrier layer, the second surface of the gate semiconductor layer being opposite the first surface of the gate semiconductor layer, the gate semiconductor layer including a sidewall connecting the first surface of the gate semiconductor layer to the second surface of the gate semiconductor layer, the etching the gate semiconductor layer including forming a plurality of surfaces having different slopes in the sidewall of the gate semiconductor layer; forming a gate electrode on the gate semiconductor layer; and forming a source and a drain in contact with a first side of the channel layer and a second side of the channel layer, respectively.

In some embodiments, in the etching the gate semiconductor layer, an angle formed by each of the plurality of surfaces and the first surface may decrease as positions of the plurality of surfaces become closer to the first surface.

In some embodiments, the plurality of surfaces may include a first inclined surface and a second inclined surface. The first inclined surface may contact the first surface of the gate semiconductor layer at a first angle. The second inclined surface may contact the second surface of the gate semiconductor layer at a second angle. The first angle may be less than the second angle.

In some embodiments, the etching the gate semiconductor layer may include forming the second inclined surface using a first gas, and forming the first inclined surface using a second gas. The second gas may be different from the first gas.

In some embodiments, the etching the gate semiconductor layer may be performed after the forming the gate electrode. Alternatively, in some embodiments, the forming the gate electrode may be performed after the etching the gate semiconductor layer.

In some embodiments, a material of the barrier layer may have a greater energy band gap than an energy band gap of a material of the channel layer.

In some embodiments, the gate semiconductor layer may include p-type GaN.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
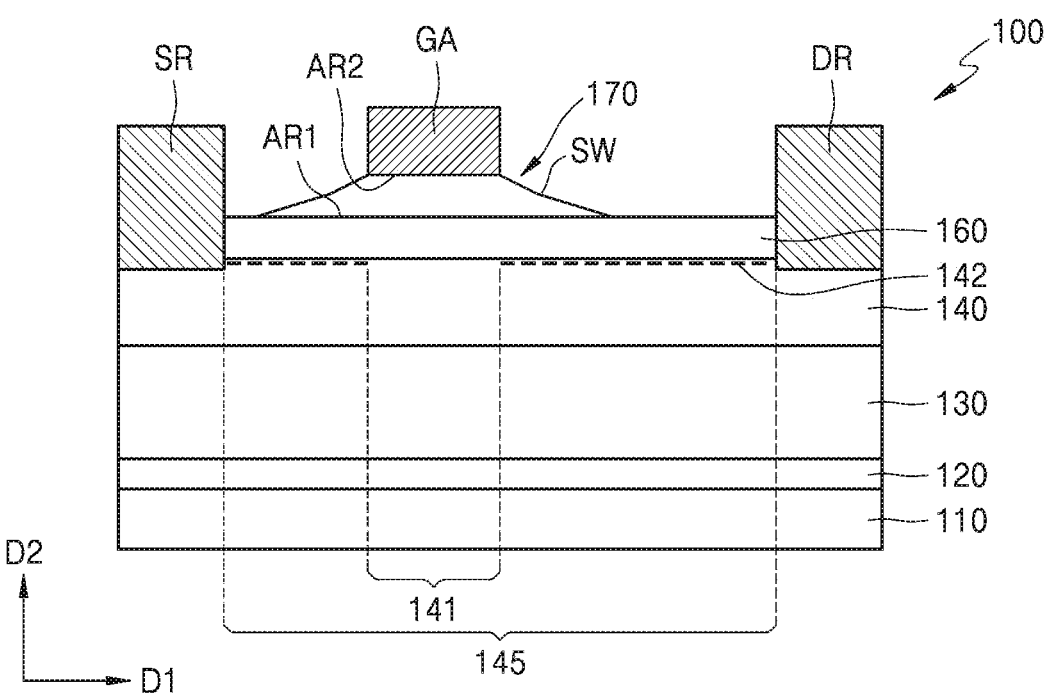
FIGS. 1A and 1B are cross-sectional views showing a schematic structure of a semiconductor device in an off state and an on state, respectively, according to an embodiment.

Reference will now be made in detail to embodiments, examples of which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, embodiments will be described in detail with reference to the accompanying drawings. The embodiments described below are merely examples, and various modifications are possible from these embodiments. In the following drawings, the same reference numerals refer to the same components, and the size of each component in the drawings may be exaggerated for clarity and convenience of description.

Hereinafter, the term "upper portion" or "on" may also include "to be present above on a non-contact basis" as well as "to be on the top portion in directly contact with".

Terms such as first, second, and the like may be used to describe various components, but are used only for the purpose of distinguishing one component from another. These terms are not intended to limit the differences in the material or structure of the components.

Singular expressions include plural expressions unless they are explicitly meant differently in context. In addition, when a part "includes" a component, this means that it may include more other components, rather than excluding other components, unless otherwise stated.

Further, the terms "unit", "module" or the like mean a unit that processes at least one function or operation, which may be implemented in hardware or software or implemented in a combination of hardware and software.

The use of the term "the" and similar indicative terms may correspond to both singular and plural.

Steps constituting the method may be performed in an appropriate order unless there is a clear statement that the steps should be performed in the order described. In addition, the use of all illustrative terms (e.g., etc.) is simply intended to detail technical ideas and, unless limited by the claims, the scope of rights is not limited due to the terms.

Figure 1B:
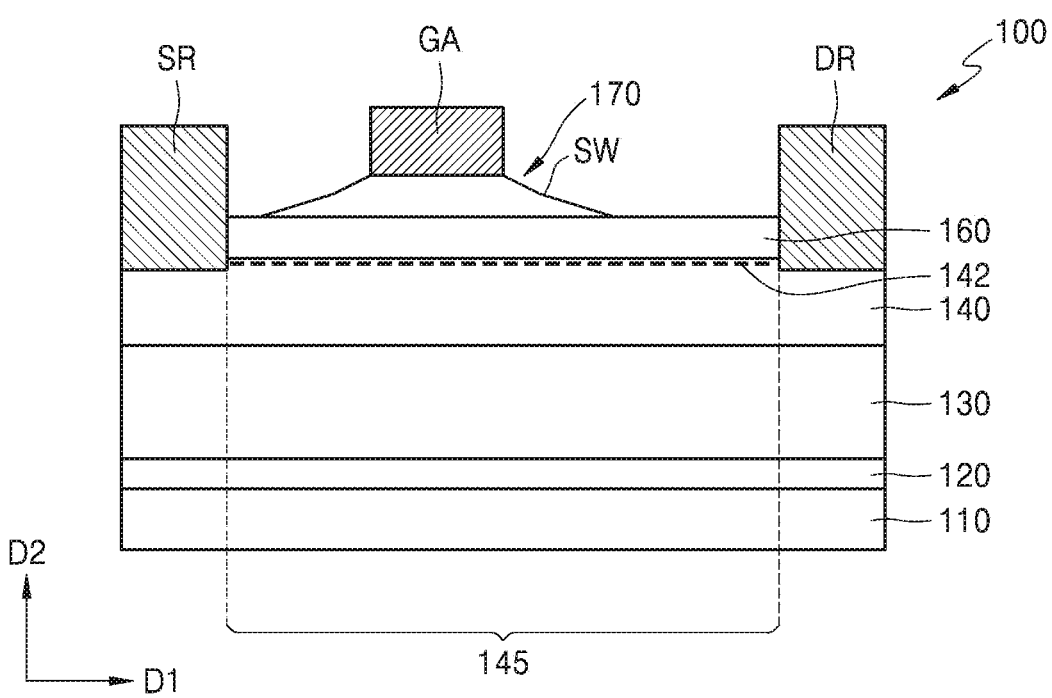

FIGS. 1A and 1B are cross-sectional views showing a schematic structure of a semiconductor device in an off state and an on state, respectively, according to an embodiment.

A semiconductor device 100 may be used as a high electron mobility transistor (HEMT). The HEMT includes semiconductor layers having different electrical polarization characteristics. In the HEMT, a semiconductor layer with a relatively large polarization rate may cause two-dimensional electron gas (2DEG) in another semiconductor layer heterogeneously bonded thereto. The 2DEG is used as a channel between a drain electrode and a source electrode, and the current flowing through this channel is controlled by a bias voltage applied to a gate electrode.

Referring to FIGS. 1A and 1B, the semiconductor device 100 may include a channel layer 140, a barrier layer 160, a gate semiconductor layer 170, a gate electrode GA, a source SR, and a drain DR. In an embodiment, a seed layer 120 and a buffer layer 130 may be sequentially provided on a substrate 110, and a channel layer 140 may be formed on the buffer layer 130.

The substrate 110 may be formed of, for example, sapphire, silicon (Si), silicon carbide (SiC), gallium nitride (GaN), etc. The buffer layer 130 may be formed on the substrate 110. The desired and/or alternatively predetermined seed layer 120 may be provided between the substrate 110 and the buffer layer 130. The seed layer 120 may be a base layer for growth of the buffer layer 130. The substrate 110, the seed layer 120, and the buffer layer 130 are layers used as needed in the manufacturing process, and may be removed from the semiconductor device 100 in the final structure operating as a HEMT. The buffer layer 130, the channel layer 140, the barrier layer 160, and the gate semiconductor layer 170 may be made of the same semiconductor-based material, and the material composition ratio may vary according to each function.

The buffer layer 130 alleviates the differences of the lattice constants and the thermal expansion coefficients between the substrate 110 and the channel layer 140 to prevent the crystallinity of the channel layer 140 from being lowered. The buffer layer 130 may have a single-layer or multi-layer structure including at least one material selected from nitrides including at least one of group III-V materials, such as Al, Ga, and In. The buffer layer 130 may be $Al_xIn_yGa_{1-x-y}N$ ($0 \leq x \leq 1$, $0 \leq y \leq 1$, $x+y \leq 1$). For example, the buffer layer 130 may have a single-layer or multi-layer structure including at least one of AlN, GaN, AlGaN, InGaN, AlInN, and AlGaInN.

The channel layer 140 is a layer that forms a channel between the source SR and the drain DR, and the channel layer 140 may be formed of a material capable of forming a two-dimensional electronic gas (2DEG) 142 therein. The channel layer 140 may have a single-layer or multi-layer structure including at least one material selected from nitrides including at least one of group III-V materials, such as Al, Ga, and In. The channel layer 140 may be $Al_xIn_yGa_{1-x-y}N$ ($0 \leq x \leq 1$, $0 \leq y \leq 1$, $x+y \leq 1$). For example, the channel layer 140 may include at least one of AlN, GaN, InN, InGaN or AlGaN, AlInN, AlInGaN, and the like. The channel layer 140 may be an undoped layer or an impurity-doped layer. The thickness of the channel layer 140 may be several hundred nm or less (e.g., 700 nm or less, 500 nm or less, 300 nm or less).

The barrier layer 160 is arranged on the channel layer 140. A region of the channel layer 140 facing the barrier layer 160 becomes a drift region 145. The drift region 145 is a region formed in the channel layer 140 between the source SR and the drain DR, and is a region where the carrier moves when the potential difference occurs between the source SR and the drain DR. As described later, the carrier movement of the drift region 145 may be allowed/blocked and adjusted according to whether a voltage is applied to the gate electrode GA and/or the magnitude of the voltage applied to the gate electrode GA.

The barrier layer 160 may include a semiconductor material different from that of the channel layer 140. The barrier layer 160 may be different from the channel layer 140 in terms of at least one of polarization characteristics, energy bandgap, and lattice constant. The barrier layer 160 may be formed of a material having an energy band gap greater than that of the channel layer 140. For example, the barrier layer 160 may have a multi-layer structure including one or more materials selected from nitrides including at least one of group III-V materials, such as Al, Ga, and In. The barrier layer 160 may be $Al_xIn_yGa_{1-x-y}N$ ($0 \leq x \leq 1$, $0 \leq y \leq 1$, $x+y \leq 1$). The barrier layer 160 may include at least one of GaN, InN, AlGaN, AlInN, InGaN, AlN, AlInGaN, and the like. The energy band gap of the barrier layer 160 may be adjusted by a composition ratio of Al and/or In.

The barrier layer 160 may be doped with desired and/or alternatively predetermined impurities. The impurities may be a p-type dopant capable of providing holes. For example, magnesium (Mg) may be used as the p-type dopant. The doping concentration of the barrier layer 160 may be set to obtain a desired threshold voltage and on-resistance.

The barrier layer 160 may have a relatively high energy band gap compared to the channel layer 140 and a higher electrical polarization rate than the channel layer 140. Accordingly, by the barrier layer 160, the two-dimensional electron gas 142 is induced in the channel layer 140 having a relatively low electrical polarization rate. In this regard, the barrier layer 160 may be referred to as a channel supply layer or a 2DEG supply layer. The 2DEG 142 may be formed in a region of the channel layer 140 below an interface between the channel layer 140 and the barrier layer 160. The 2DEG 142 exhibits very high electron mobility.

Although the barrier layer 160 is illustrated as a single layer, it may be composed of a plurality of layers. The barrier layer 160 may include, for example, a plurality of layers having different energy band gaps, and a plurality of layers may be arranged so that the energy band gap of a layer close to the channel layer 140 among the plurality of layers is larger.

The source SR and the drain DR are formed on the channel layer 140 to be spaced apart from each other. The source SR may be formed on one side of the channel layer 140 to be electrically connected to the channel layer 140, and the drain DR may be formed on the other side of the channel layer 140 to be electrically connected to the channel layer 140. The source SR and the drain DR are formed outside the drift region 145 on the channel layer 140. The source SR and the drain DR are in ohmic contact with the channel layer 140. The source SR and the drain DR may be formed of an electrically conductive material, for example, a metal material. A region in which the source SR and the drain DR are in contact with each other in the channel layer 140 may be doped at a higher concentration than other regions of the channel layer 140. The 2DEG 142 formed in the channel layer 140 may be used as a current path between the source SR and the drain DR, that is, a channel.

The gate semiconductor layer 170 is located on the barrier layer 160. The gate semiconductor layer 170 is positioned between the source SR and the drain DR to be spaced apart from the source SR and the drain DR. The gate semiconductor layer 170 may be positioned closer to the source SR than the drain DR. The gate semiconductor layer 170 may have an energy band gap different from that of the barrier layer 160. The gate semiconductor layer 170 may be a p-type semiconductor layer. The gate semiconductor layer 170 may include one or more materials selected from group III-V materials, such as nitrides including at least one of Al, Ga, and In. The gate semiconductor layer 170 may be $Al_xIn_yGa_{1-x-y}N$ ($0 \leq x \leq 1$, $0 \leq y \leq 1$, $x+y \leq 1$). The gate semiconductor layer 170 may include at least one of GaN, InN, AlGaN, AlInN, InGaN, AlN, AlInGaN, and the like. The gate semiconductor layer 170 may be doped with p-type impurities such as magnesium (Mg). The gate semiconductor layer 170 may be a p-GaN layer. However, the embodiments are not limited thereto, and for example, the gate semiconductor layer 170 may be a p-AlGaN layer.

The gate semiconductor layer 170 may form a depletion region in the channel layer 140. The level of the energy band of a partial region of the barrier layer 160 at a position facing the gate semiconductor layer 170 is increased by the gate semiconductor layer 170, and a depletion region 141 may be formed in a region of the channel layer 140 facing the partial region of the barrier layer 160. The depletion region 141 is a region of the channel path of the channel layer 140 in which the 2DEG 142 is not formed or an electron concentration lower than that of the remaining regions is provided. In other words, the 2DEG 142 is not connected, but is cut off by the depletion region 141. Accordingly, no current flows between the source SR and the drain DR, that is, the channel path is blocked. The semiconductor device 100 may be a high electron mobility transistor having a normally off characteristic. The normally off characteristic refers to a characteristic in which the transistor is turned off as shown in FIG. 1A in a gate-off state, that is, a normal state in which a voltage is not applied to the gate electrode GA. When a voltage higher than a threshold voltage is applied to the gate electrode GA, a 2DEG 142 is formed on the entire channel path between the source SR and the drain DR and is turned on, instead of the depletion region 141 of FIG. 1A.

A gate electrode GA is formed on the gate semiconductor layer 170. The gate electrode GA is in ohmic contact with the gate semiconductor layer 170. The gate electrode GA may be formed of an electrically conductive material, for example, a metal material. When a voltage is not applied to the gate electrode GA, a depletion region 141 is formed in the channel layer 140 and a channel by the 2DEG 142 is not formed. The state shown in FIG. 1A is an off state in which current does not flow from the source SR to the drain DR. When a voltage above a threshold voltage is applied to the gate electrode GA, the concentration of the 2DEG 142 increases in the region facing the gate semiconductor layer 170 in the channel layer 140, and the range of the 2DEG 142 expands such that the depletion region 141 disappears and a channel is formed. The state shown in FIG. 1B is an on state in which a current flows from the source SR to the drain DR.

In the semiconductor device 100 according to an embodiment, the gate semiconductor layer 170 is provided to suit the normally off characteristics as described above, and a detailed configuration may be determined to reduce the gate leakage current.

The gate semiconductor layer 170 may include a first surface AR1 in contact with the barrier layer 160, a second surface AR2 in contact with the gate electrode GA and having an area narrower than the first surface AR1, and a sidewall SW connecting the first surface AR1 with the second surface AR2. The sidewall SW of the gate semiconductor layer 170 may include a plurality of surfaces (e.g., inclined surfaces) having different slopes. Here, the slope refers to the slope viewed in a cross section parallel to a first direction (D1 direction) which is the separation direction between the source SR and the drain DR and a second direction (D2 direction) which is the stacking direction of the semiconductor device 100. In this cross-section, a width of the first surface AR1 in the first direction (D1 direction) is greater than a width of the second surface AR2 in the first direction (D1 direction). In this cross section, the slope of the sidewall SW may be expressed at an angle formed by the sidewall SW in the first direction (D1 direction). The slope of the sidewall SW may be smaller than the slope of a position farther than the barrier layer 160 at a position close to the barrier layer 160. A detailed example structure thereof will be described in detail with reference to FIGS. 2 to 5.

The gate semiconductor layer 170 may have a thickness of 2 to 200 nm. The thickness of the gate semiconductor layer 170 may be, for example, 10 nm to 200 nm. The thickness of the gate semiconductor layer 170 may be determined to be suitable for normal off characteristics. When the thickness of the gate semiconductor layer 170 is less than a desired and/or alternatively predetermined reference, the depletion region 141 is not formed in the channel layer 140, and thus a normally on characteristic in which a current flows in an off state may appear. When the thickness of the gate semiconductor layer 170 exceeds a desired and/or alternatively predetermined standard, the energy band level of the barrier layer 160 facing the gate semiconductor layer 170 may be excessively high, and the bias voltage applied to the gate electrode GA to set the HEMT to an on state may become excessively high.

In general, a high electron mobility transistor used as a power device may require a high threshold voltage. In addition, it may be necessary to lower the on-resistance in order to implement a high electron mobility transistor capable of high-speed operation. The threshold voltage and on-resistance may be adjusted by changing the impurity concentration of the gate semiconductor layer 170, and the impurity concentration of the gate semiconductor layer 170 may affect the gate leakage current. Increasing the impurity concentration of the gate semiconductor layer 170 may increase the impurity concentration at the boundary between the gate semiconductor layer 170 and the gate electrode GA, thereby generating a gate leakage current. In addition, when the concentration of impurities in the gate semiconductor layer 170 is increased, the impurities diffuse into the channel layer 140, which may make it difficult to control the positions of the diffused impurities. As described above, it is not easy to control the threshold voltage, the on-resistance, and the gate leakage current only with the concentration of the impurities of the gate semiconductor layer 170.

In order to reduce the gate leakage current, plasma treatment, heat treatment, a method of using a metal having a high work function in the gate electrode GA, and the like are generally used. Among them, the plasma treatment may cause damage to the semiconductor device 100 due to high operating voltage.

In the semiconductor device 100 of the embodiment, the gate semiconductor layer 170 controls the distribution of electric field intensity in the gate semiconductor layer 170 by adjusting the shape of the sidewall SW between the gate electrode GA and the barrier layer 160, for example, a slope. Electrical characteristics such as reduction of leakage current may be improved by adjusting the electric field distribution.

FIGS. 2 to 5 illustrate example detailed shapes of a gate semiconductor layer provided in a semiconductor device according to an embodiment.

Figure 2:
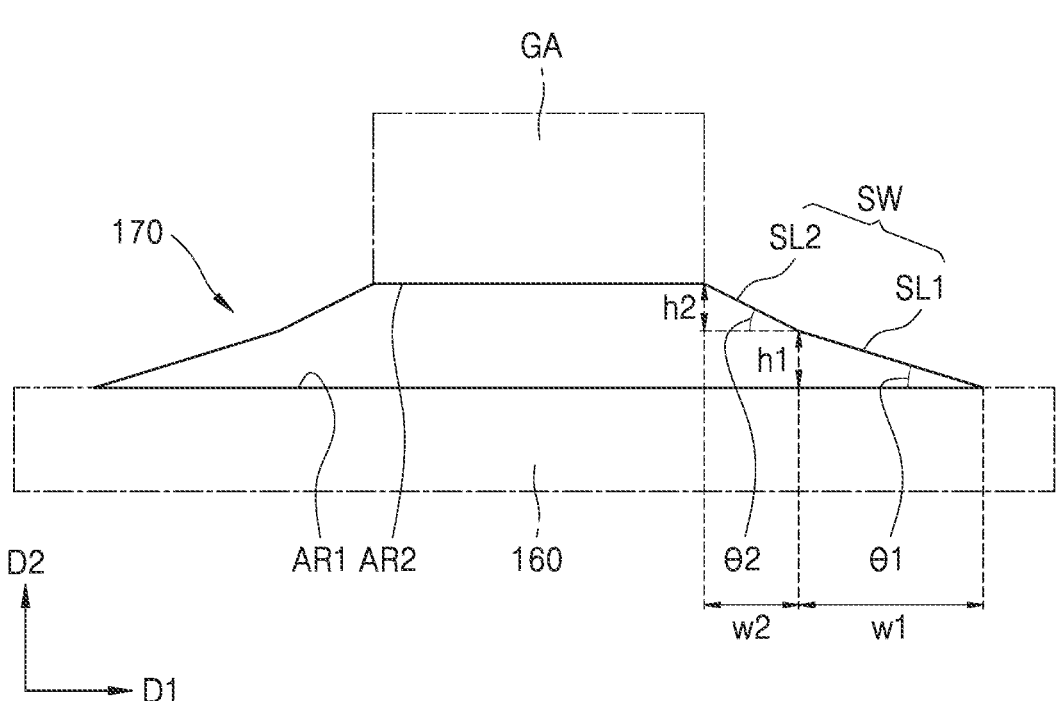
FIG. 2 illustrates an example of a shape of a gate semiconductor layer provided in a semiconductor device according to an embodiment.

Referring to FIG. 2, the gate semiconductor layer 170 may include a first surface AR1 in contact with the barrier layer 160, a second surface AR2 in contact with the gate electrode GA and having an area narrower than the first surface AR1, and a sidewall SW connecting the first surface AR1 with the second surface AR2. The width of the first surface AR1 in the first direction (D1 direction) may be smaller than the width of the second surface AR2 in the first direction (D1 direction). The sidewall SW includes a first inclined surface SL1 and a second inclined surface SL2. The first inclined surface SL1 is in contact with the first surface AR1 at an angle of $\theta 1$. That is, one side of the first inclined surface SL1 is in contact with the first surface AR1, and an angle formed by the first inclined surface SL1 in the first direction (D1 direction) is $\theta 1$. The second inclined surface SL2 is in contact with the second surface AR2 at an angle of $\theta 2$. That is, one side of the second inclined surface SL2 is in contact with the second surface AR2, and an angle formed by the second inclined surface SL2 in the first direction (D1 direction) is $\theta 2$. $\theta 1$ is less than $\theta 2$. $\theta 1$ may be less than or equal to 40°. $\theta 1$ may be greater than 0°, 40° or less, 35° or less, or 30° or less. $\theta 2$ may be 50° or more. $\theta 2$ may be, for example, 60° or more and 90° or less.

According to the angle requirement, the heights h1 and h2 in the second direction D2 of the first inclined surface SL1 and the second inclined surface SL2 and the widths w1 and w2 in the first direction D1 thereof may be set. Each of h1 and h2 may be 1 nm or more and 100 nm or less. w1 may be 1 nm or more and 200 nm or less. w2 may be greater than or equal to 0 nm and less than or equal to 200 nm. h1/w1 may be less than h2/w2. h1 and h2 are the same, in which case w1 may be greater than w2, and for example, w1 may be 1.5 times, 2 times, or 3 times as much as w2.

Even when h1 and h2 are different, for example, even when h2 is greater than h1, w1 may be greater than w2. When h2 is greater than h1, w1 and w2 correspond to a requirement $\theta 1 < \theta 2$ even if they are the same, but even in this case, w1 may be additionally formed to be greater than w2. In other words, the width w1 of the first direction (D1 direction) of the first inclined surface SL1 having a small inclination angle may be greater than the width w2 of the first direction (D1 direction) of the second inclined surface SL2. This is because the effect of relieving the electric field in the gate semiconductor layer 170 may be further increased by setting h1, h2, w1, and w2 to satisfy a requirement of w1>w2 together with the requirement of $\theta 1 < \theta 2$. For example, when w1 is formed longer even if the inclination angle of the first inclined surface SL1 is the same, the region where the electric field is relieved in the gate semiconductor layer 170 may increase and the leakage current reduction effect may increase. However, this is only an example case and the embodiment is not limited thereto.

The first inclined surface SL1 and the second inclined surface SL2 are not limited to flat surfaces. When the first inclined surface SL1 or the second inclined surface SL2 is not flat or is a curved surface, $\theta 1$ may be defined at a position where the first inclined surface SL1 contacts the first surface AR1, and $\theta 2$ may be defined at a position where the second inclined surface SL2 contacts the first inclined surface SL1. Alternatively, $\theta 1$ and $\theta 2$ may be defined as the average slopes of the first inclined surface SL1 and the second inclined surface SL2, respectively.

As described above, the formation of the first inclined surface SL1 and the second inclined surface SL2 having different slopes may be performed by different processes. For example, the first inclined surface SL1 and the second inclined surface SL2 may be formed in different gas ambient, i.e., using different etching gases.

In FIG. 2, the sidewall SW is described on the right side of the gate semiconductor layer 170, but this is only an example, and the sidewall SW on the left side of the gate semiconductor layer 170 may be designed on a similar basis. This is the same in the following drawings. Sidewalls SW of both sides of the gate semiconductor layer 170 may be formed to be similar or the same. However, the sidewalls SW of both sides of the gate semiconductor layer 170 are not limited thereto. For example, the slope of the sidewall SW close to the source SR and the slope of the sidewall SW close to the drain DR may be set slightly differently.

Figure 3:
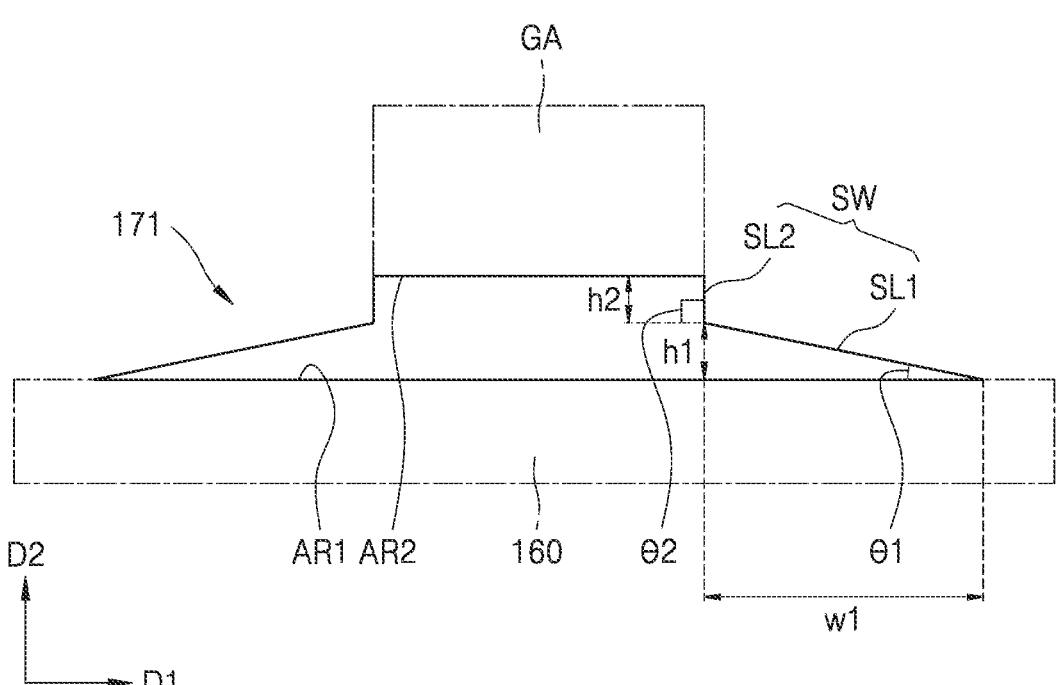
FIG. 3 illustrates another example of a shape of a gate semiconductor layer provided in a semiconductor device according to an embodiment.

Referring to FIG. 3, the shape of the sidewall SW of the gate semiconductor layer 171 is different from that of FIG. 2 in that the inclination angle $\theta 2$ of the second inclined surface SL2 is changed to 90°. That is, it is an example in which the difference between $\theta 1$ and $\theta 2$ is maximized, and in this case, it may be expected that the effect of improving the electrical characteristics will be further increased. However, it is not meaningful to make 82 exactly 90°, and 82 may be set to improve the effect appropriately with 88°, 85°, 80°, 75°, etc., and to suit the process.

Figure 4:
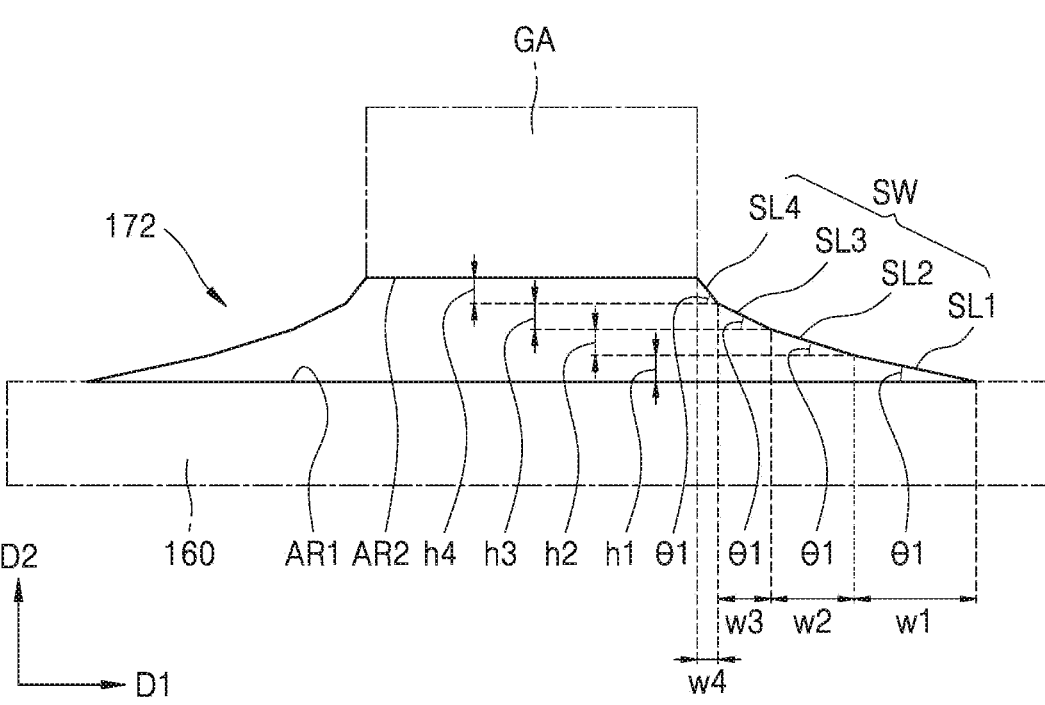
FIG. 4 illustrates another example of a shape of a gate semiconductor layer provided in a semiconductor device according to an embodiment.

Referring to FIG. 4, the gate semiconductor layer 172 may include a first surface AR1 in contact with the barrier layer 160, a second surface AR2 in contact with the gate electrode GA and having an area narrower than the first surface AR1, and a sidewall SW connecting the first surface AR1 with the second surface AR2. The sidewalls SW include a first inclined surface SL1, a second inclined surface SL2, a third inclined surface SL3, and a fourth inclined surface SL4. The first inclined surface SL1, the second inclined surface SL2, the third inclined surface SL3, and the fourth inclined surface SL4 have different height positions from the first surface AR1, and the angles formed by the first inclined surface SL1, the second inclined surface SL2, the third inclined surface SL3, and the fourth inclined surface SL4 in the first direction (D1 direction) are $\theta 1$, $\theta 2$, $\theta 3$, and $\theta 4$, respectively. $\theta 1$, $\theta 2$, $\theta 3$, and $\theta 4$ may have a relationship of $\theta 1 < \theta 4$. Alternatively, it may have a relationship of $\theta 1 < \theta 2 < \theta 4$, or a relationship of $\theta 1 < \theta 3 < \theta 4$. Alternatively, it may have a relationship of $\theta 1 < \theta 2 < \theta 3 < \theta 4$. In other words, as the four inclined surfaces approach the first surface AR1, the inclination angle formed by the four inclined surfaces in the first direction (D1 direction) may generally decrease, but may include a relationship of $\theta 1 > \theta 2$, a relationship of $\theta 2 > \theta 3$, or a relationship of $\theta 3 > \theta 4$, which has a minor difference.

The inclination angle $\theta 1$ of the first inclined surface SL1 in contact with the first surface AR1 may be greater than 0°, less than or equal to 40°, less than or equal to 35°, or less than or equal to 30°. The inclination angle $\theta 4$ of the fourth inclined surface SL4 in contact with the second surface AR2 may be 50° or more. 84 may be, for example, 60° or more and 90° or less.

According to the angle requirement, heights h1, h2, h3, h4 in the second direction (D2 direction) and widths w1, w2, w3, and w4 in the first direction (D1 direction) of each of the first to fourth inclined surfaces SL1, SL2, SL3, and SL4 forming the sidewalls SW may be set. Each of h1, h2, h3, and h4 may be 1 nm or more and 100 nm or less. The variables h1, h2, h3, h4, w1, w2, w3, and w4 may have a relationship of h1/w1<h4/w4. Alternatively, it may have a relationship of h1/w1<h2/w2<h4/w4, or a relationship of h1/w1<h3/w3<h4/w4. Alternatively, a relationship of h1/w1<h2/w2<h3/w3<h4/w4 may be satisfied.

It may be h1=h2=h3=h4, and in this case, a relationship of w1>w4 or w1>w3>w4 or w1>w2>w4 may be satisfied. w1 may be 1.5 times, 2 times, or 3 times as much as w4.

Regardless of h1, h2, h3, and h4, w1 may be formed greater than w4. For example, when h1 is less than h4, w1 and w4 may meet the requirement of $\theta 1 < \theta 4$, even if w1 and w4 are same, but w1 and w4 may be set to satisfy the requirement of w1>w4 together to increase the field relief effect. Although the relationship between the first inclined surface SL1 and the fourth inclined surface SL4 has been described, the similar relationship may be satisfied for any other two inclined surfaces.

Similarly, h1, h2, h3, h4, w1, w2, w3, and w4 may be set to satisfy the requirement of w1>w2>w4 together with the requirement of $\theta1<\theta2<\theta4$ or the requirement of w1>w3>w4 together with the requirement of $\theta1<\theta3<\theta4$.

Alternatively, h1, h2, h3, h4, w1, w2, w3, and w4 may be set to satisfy the requirement of w1>w2>w3>w4 together with the requirement of $\theta1<\theta2<\theta3<\theta4$. This is only illustrative and the embodiments are not limited thereto.

FIG. 4 illustrates a case in which the gate semiconductor layer 172 of FIG. 4 has four inclined surfaces, and the number of inclined surfaces may be changed to three or more and various numbers. In addition, as described above, not all of the plurality of surfaces may be flat surfaces, and one or more of them may not be flat but may be curved.

Figure 5:
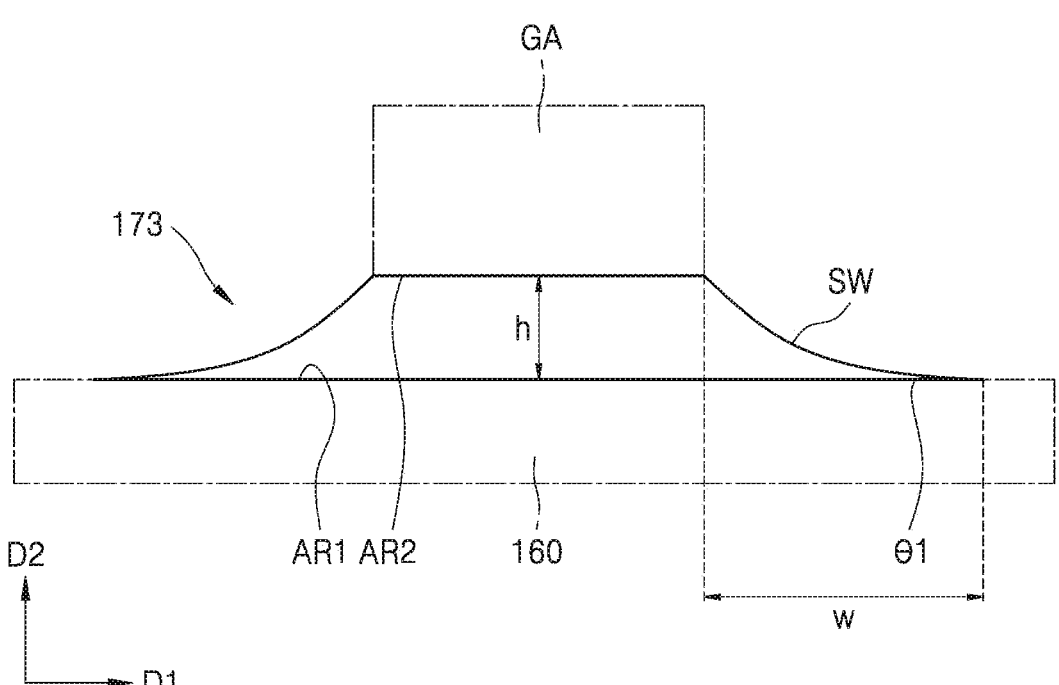
FIG. 5 illustrates another example of a shape of a gate semiconductor layer provided in a semiconductor device according to an embodiment.

Referring to FIG. 5, the sidewall SW of the gate semiconductor layer 173 may have a concave curved surface shape. Such a curved surface may be defined as being formed in the sufficient number of a plurality of surfaces satisfying the above-described angle requirement, that is, in which the inclination angle of the inclined surface is small as it is closer to the first surface AR1. Slopes of the curved sidewall SW at different height positions may be defined as slopes of tangent lines at corresponding positions. This slope may decrease as it approaches the first surface AR1. An angle $\theta1$ indicating a slope at a position where the sidewall SW is in contact with the first surface AR1 may be the smallest when compared with slopes at other positions.

Figure 6A:
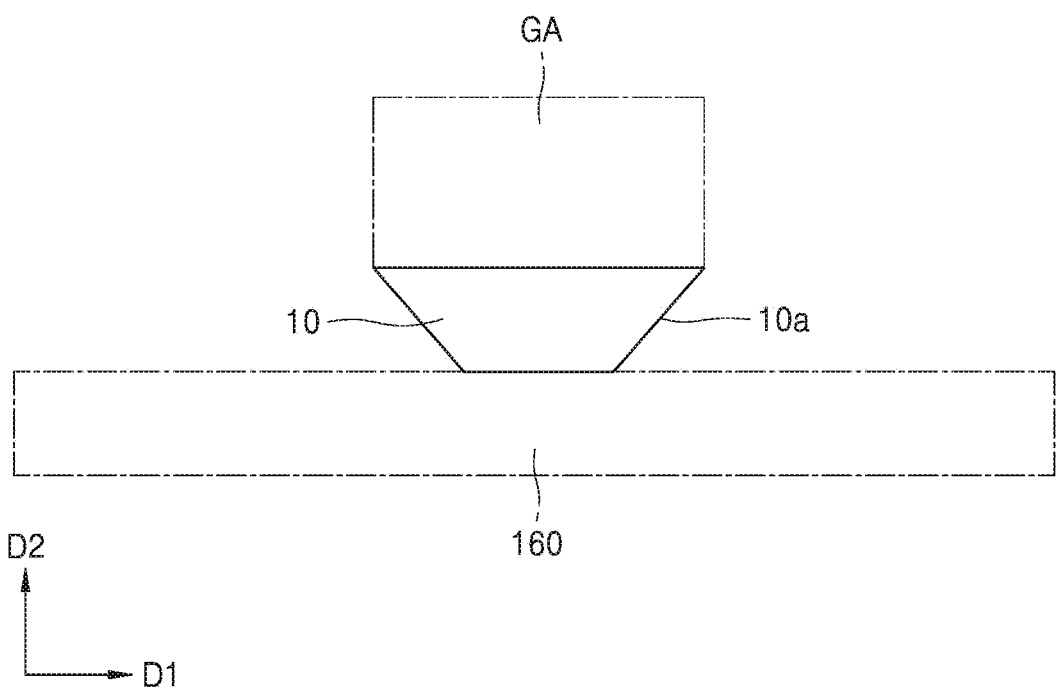
FIGS. 6A to 6C illustrate an example of a shape of a gate semiconductor layer provided in a semiconductor device according to comparative examples.
Figure 6B:
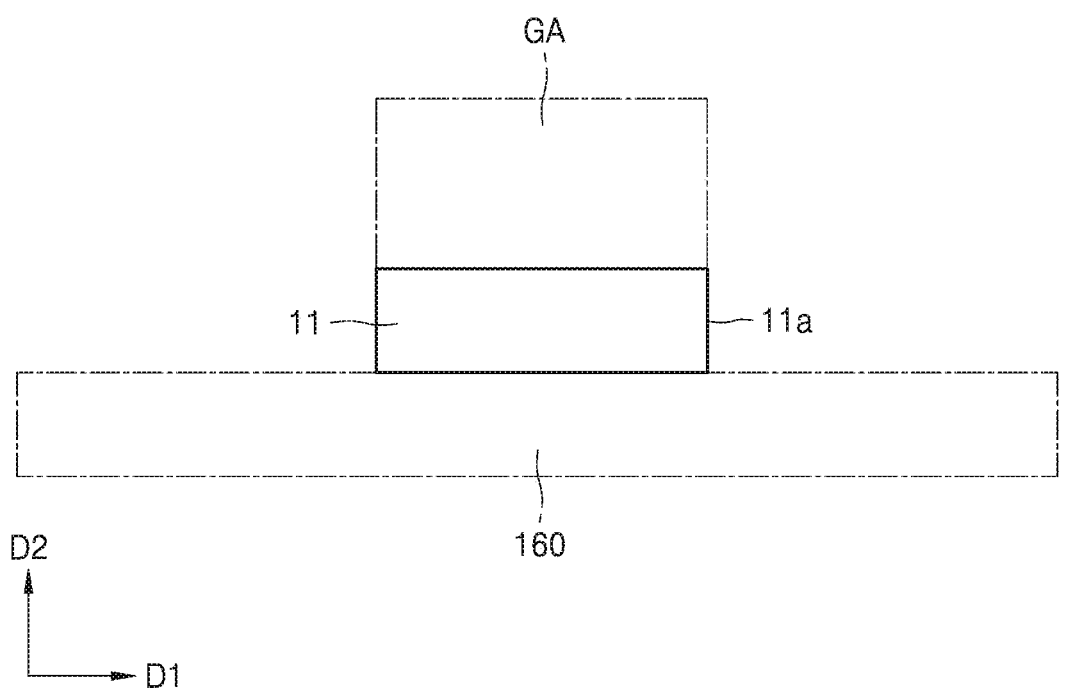
Figure 6C:
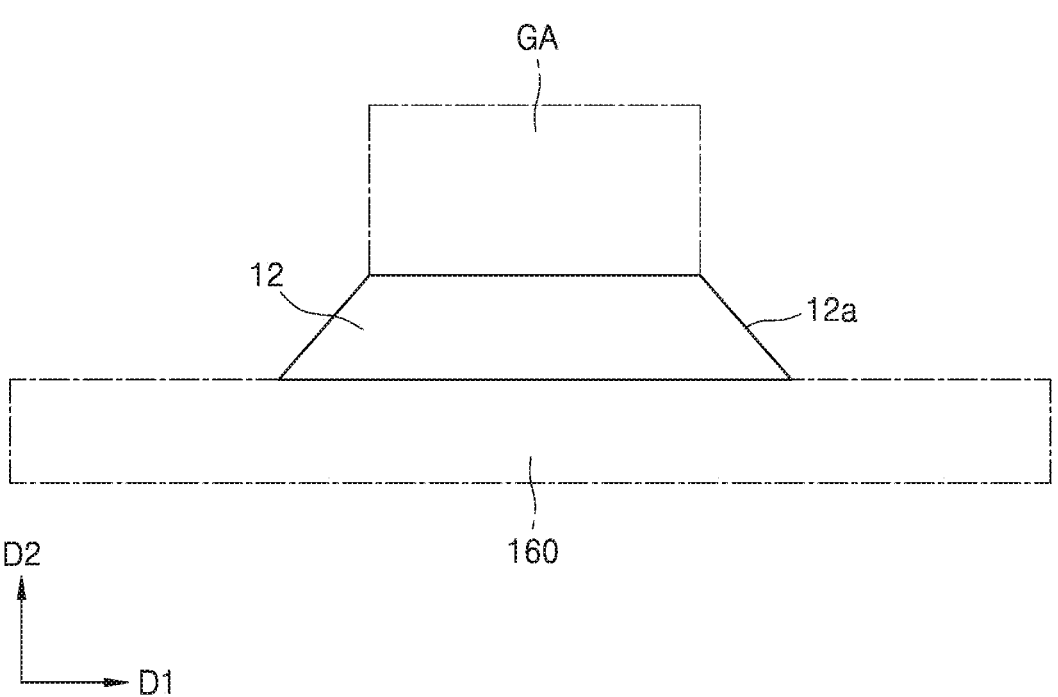

FIGS. 6A to 6C illustrate an example shape of a gate semiconductor layer provided in a semiconductor device according to comparative examples.

Referring to FIG. 6A, the area of the upper surface of the gate semiconductor layer 10 in contact with the gate electrode GA is larger than the area of the lower surface of the gate semiconductor layer 10 in contact with the barrier layer 160, and the inclined direction of the sidewall SW is opposite to that of the embodiment. This slope may be referred to as a negative slope.

Referring to FIG. 6B, an area of an upper surface of the gate semiconductor layer 11 contacting the gate electrode GA is equal to an area of a lower surface of the gate semiconductor layer 11 contacting the barrier layer 160, and a slope of the sidewall SW is 90°.

Referring to FIG. 6C, the gate semiconductor layer 12 is similar to that of the embodiment in that the area of the upper surface of the gate semiconductor layer 12 in contact with the gate electrode GA is smaller than the area of the lower surface of the gate semiconductor layer 12 in contact with the barrier layer 160, and the sidewall SW is different from that of the embodiment in that the sidewall SW is formed of one inclined surface.

Table 1 is a table comparing electrical characteristics of comparative examples and embodiment.

TABLE 1

| | Ig_forward (at 6 V($\mu$A/mm)) | Id (at 700 V(A/mm)) |
|---|---|---|
| Embodiment | 5.80E−01 | 2.65E−11 |
| Comparative example 1 | 6.25E−01 | 5.01E−07 |
| Comparative example 2 | 6.16E−01 | 2.28E−09 |
| Comparative example 3 | 5.22E+00 | 1.03E−10 |

In Table 1, the embodiment is related to the shape of the gate semiconductor layer 170 illustrated in FIG. 2, and comparative example 1, comparative example 2, and comparative example 3 are related to the shape of the gate semiconductor layers 10 and 11 and 12 illustrated in FIGS. 6A, 6B, and 6C, respectively.

Ig_forward denotes a gate leakage current in an on state, and Id denotes a drain current in an off state. The shape of the gate semiconductor layer had little effect on the threshold voltage, which was analyzed through computer simulation. As shown in Table 1, in the case of the embodiment, it is analyzed that the gate leakage current in the on state is less than those of the comparative examples, and the drain current in the off state is also less than those of the comparative examples.

Table 1 includes one computer simulation result for an embodiment, but in the case of the embodiment, as the inclination angle $\theta1$ of the first inclined surface SL1 in contact with the first surface AR1 gets less and the inclination angle $\theta2$ of the second inclined surface SL2 in contact with the second surface AR2 gets greater, it has been confirmed that the gate leakage current in an on state and the drain current in an off state are generally reduced.

These results are analyzed to be due to the mitigation of the electric field formed in the region of the gate semiconductor layer 170 at the location adjacent to the channel layer 140 by the shape of the gate semiconductor layer 170.

Hereinafter, a method of manufacturing a semiconductor device having a gate semiconductor layer shape as described above will be described.

The semiconductor device manufacturing method may include sequentially forming a channel layer, a barrier layer, and a gate semiconductor layer on a substrate, etching the gate semiconductor layer so that an area of a first surface in contact with the barrier layer is wider than an area of a second surface facing the first surface, and forming a gate electrode on the gate semiconductor layer.

In the etching of the gate semiconductor layer, a process requirement may be set such that the sidewall SW of the gate semiconductor layer has a plurality of surfaces (e.g., inclined surfaces) having different slopes.

The forming of the gate electrode may be performed before or after the etching process described above.

FIGS. 7A to 7G are diagrams illustrating a method of manufacturing a semiconductor device according to an embodiment.

Figure 7A:
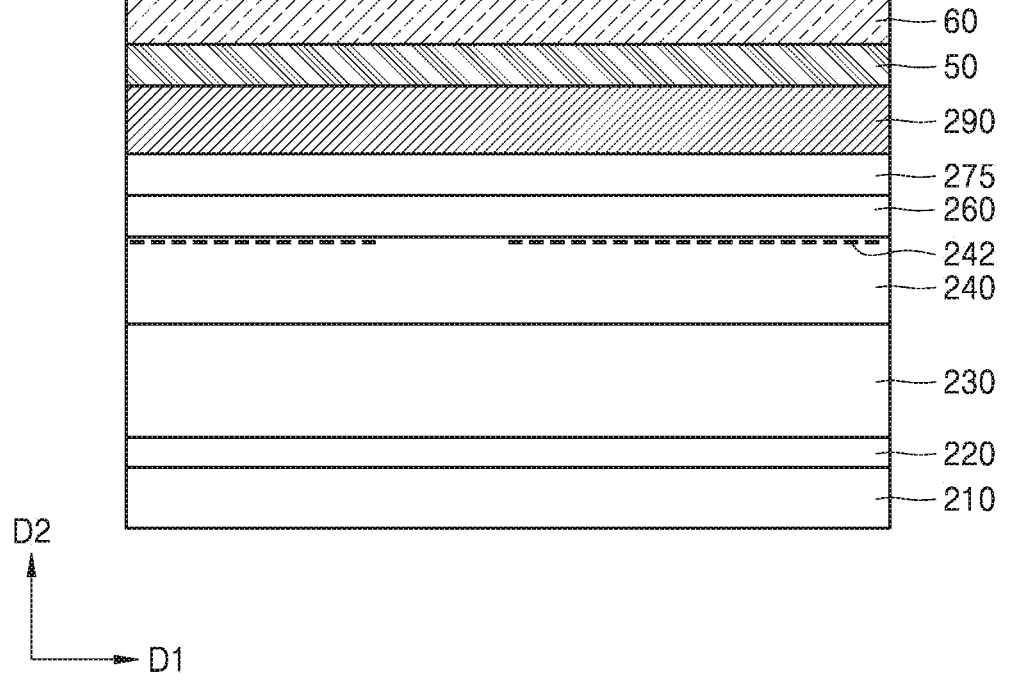
FIGS. 7A to 7G are diagrams illustrating a method of manufacturing a semiconductor device according to an embodiment.

Referring to FIG. 7A, a channel layer 240, a barrier layer 260, a gate semiconductor layer 275, and a gate electrode material layer 290 are sequentially formed on a substrate 210. A seed layer 220 and a buffer layer 230 may be formed between the substrate 210 and the channel layer 240. The channel layer 240 includes a 2DEG 242 induced by the barrier layer 260. The materials of the substrate 210, the seed layer 220, the buffer layer 230, the channel layer 240, the barrier layer 260, the gate semiconductor layer 275, and the gate electrode material layer 290 may adopt the materials provided for the substrate 110, the seed layer 120, the buffer layer 130, the channel layer 140, the barrier layer 160, the gate semiconductor layer 170 and the gate electrode GA.

Figure 7B:
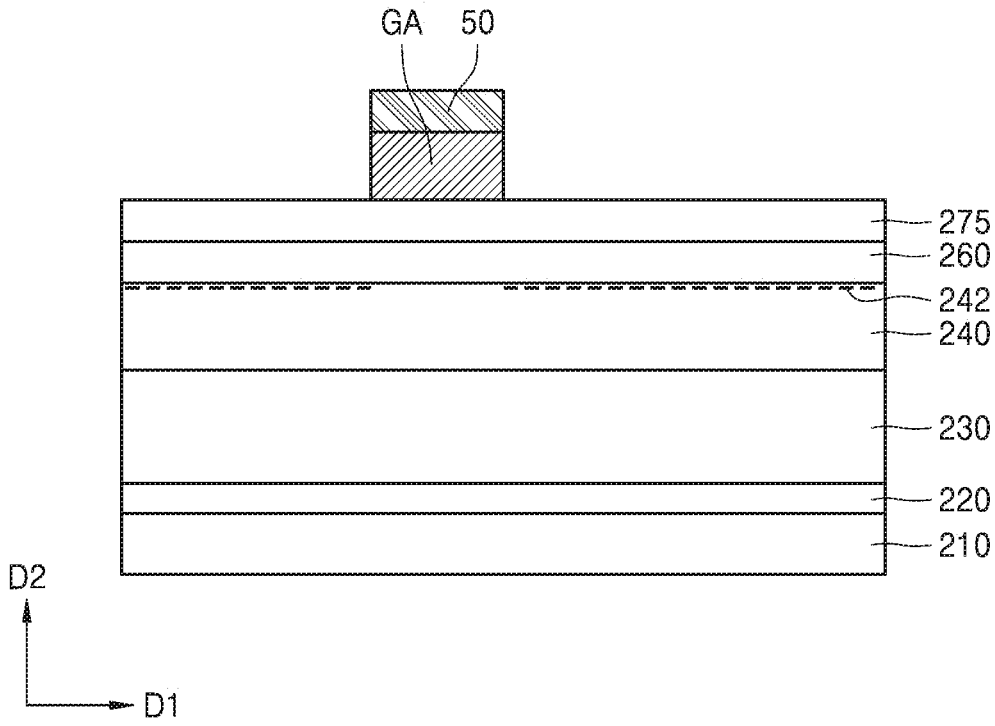

A hard mask layer 50 and a photoresist layer 60 may be formed on the gate electrode material layer 290. Through a photolithography process using the photoresist layer 60, the hard mask layer 50 may be suitably patterned based on the width of the gate electrode to be formed. The gate electrode GA may be formed as shown in FIG. 7B by etching the gate electrode material layer 290 using the patterned hard mask layer 50.

Figure 7C:
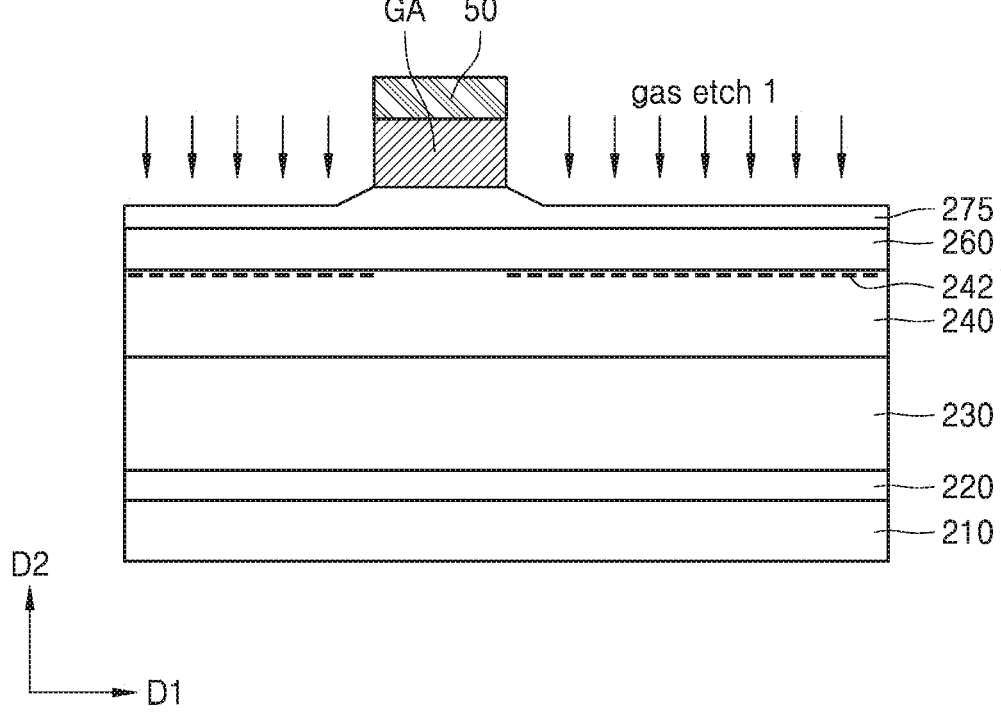
Figure 7D:
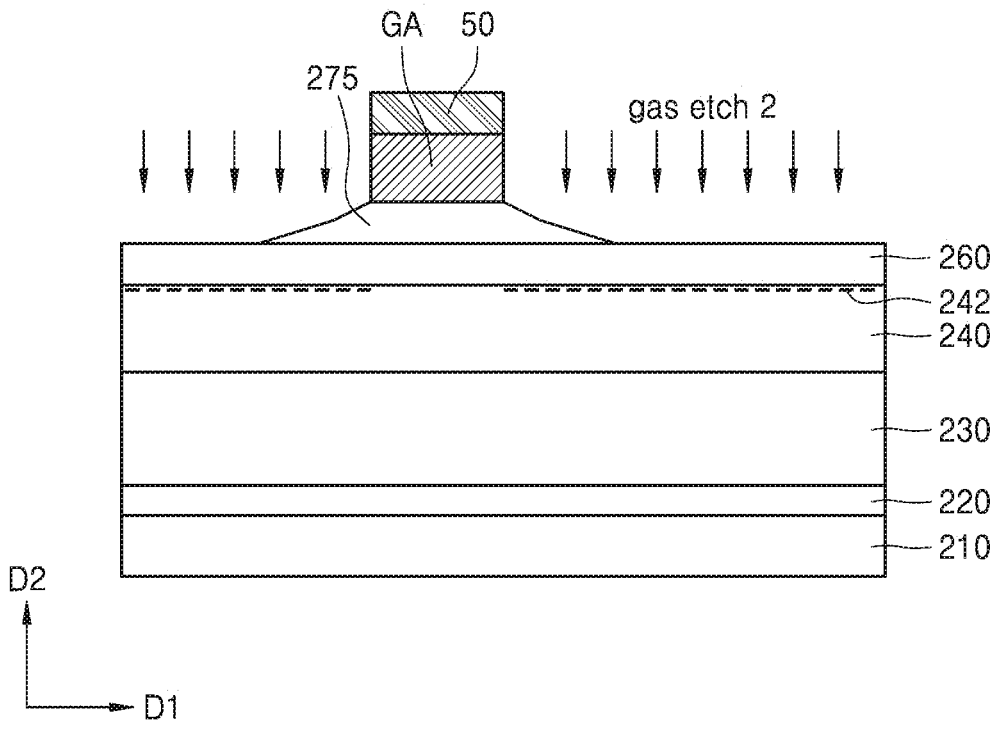

FIGS. 7C and 7D illustrate a process of dry etching the gate semiconductor layer 275 over primary and secondary processes. FIG. 7C illustrates a process of forming an inclined surface having a relatively large inclination angle using a first gas, and FIG. 7D illustrates a process of forming an inclined surface having a relatively small inclination angle using a second gas. These processes may be performed in a gas ambient such as $Cl_2$, $BCl_3$, $N_2$, $O_2$, Ar, or the like. The first gas used in the etching process performed in FIG. 7C and the second gas used in the etching process performed in FIG. 7D may be different from each other. The higher the $Cl_2$ ratio, the easier it is to form an inclined surface having a steep slope, and the higher the $BCl_3$ ratio, the easier it is to form a gentle inclined surface. Each of the first gas and the second gas may include one or more of the gases described above, the first gas may have a higher $Cl_2$ ratio than the second gas, and the second gas may have a higher $BCl_3$ ratio than the first gas. Alternatively, the first gas may be $Cl_2$, and the second gas may be $BCl_3$. However, this is only illustrative and the embodiments are not limited thereto.

Figure 7E:
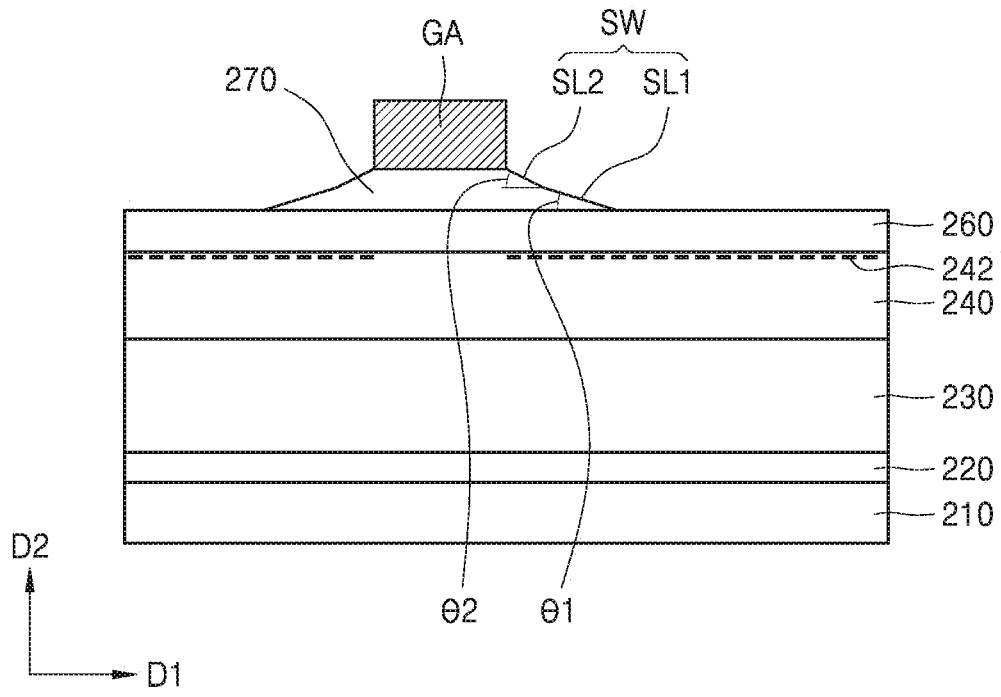

Referring to FIG. 7E, the gate semiconductor layer (270) is formed in a shape having a sidewall SW including a first inclined surface SL1 and a second inclined surface SL2 with different slopes. That is, in the primary etching process of FIG. 7C, a second inclined surface SL2 having an inclination angle θ2 is formed first, and in the secondary etching process of FIG. 7D, a first inclined surface SL1 having an inclination angle θ1 less than θ2 is formed, so that the gate semiconductor layer 270 shown in FIG. 7E may be provided.

Figure 7F:
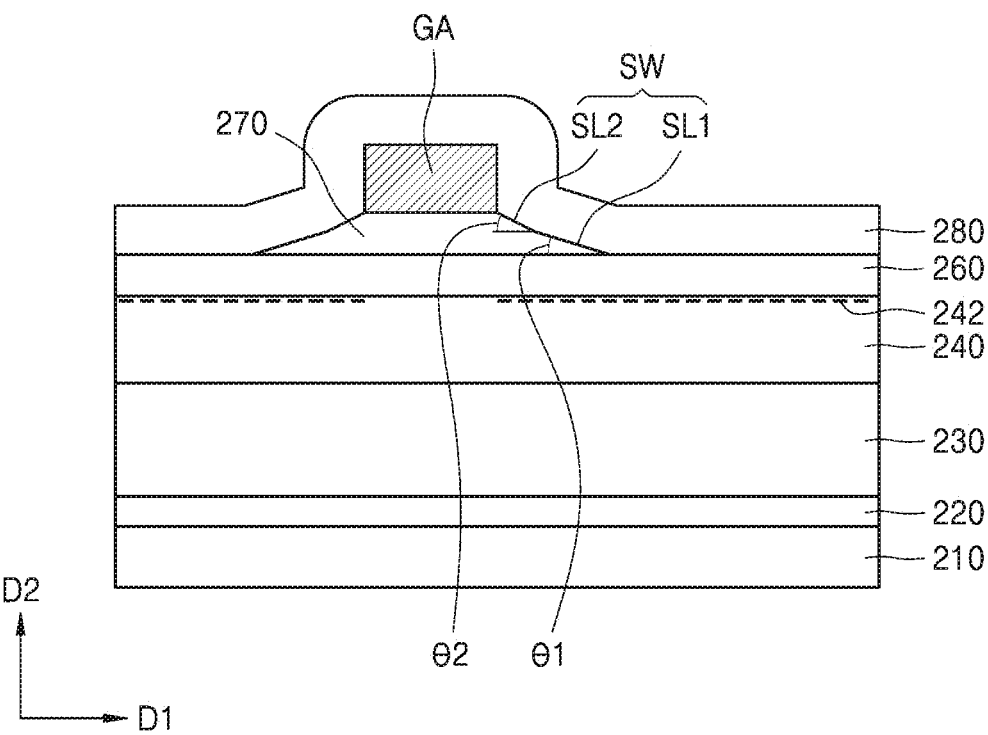

Next, as shown in FIG. 7F, a passivation layer 280 covering a barrier layer 260, a gate semiconductor layer 270, and the gate electrode GA is formed. The passivation layer 280 may include various kinds of insulating materials, for example, oxides such as $SiO_2$, $HfO_x$, and $Al_2O_3$.

Figure 7G:
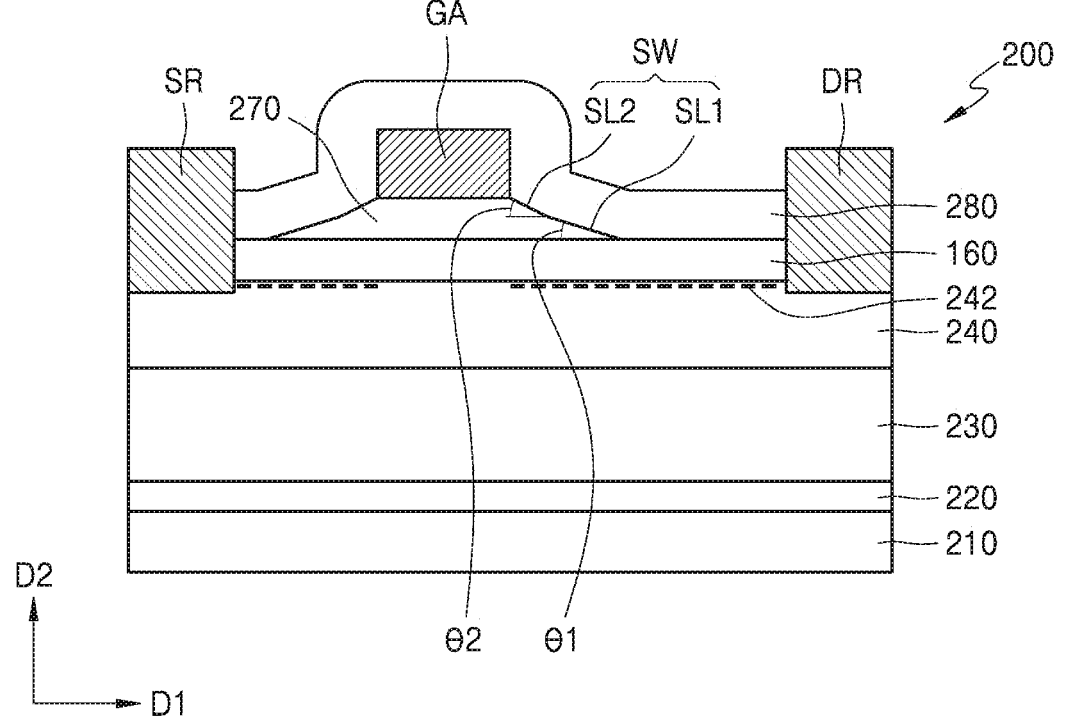

Thereafter, as shown in FIG. 7G, a source SR and a drain DR that pass through the passivation layer 280 and contact the channel layer 240 are formed.

The semiconductor device 200 manufactured as described above may be substantially the same as the semiconductor device 100 described in FIGS. 1A and 1B, and the shape of the gate semiconductor layer 270 may be changed to the gate semiconductor layer 171, 172, 173, or 174 illustrated in FIGS. 2 to 5 or a combination thereof.

The manufacturing processes of FIGS. 7A to 7G are processes in which the gate electrode GA is first formed and then the gate semiconductor layer 270 is formed in a shape having the sidewall SW having the plurality of surfaces having different slopes. The plurality of surfaces having different slopes may be a plurality of inclined surfaces having different slopes.

FIGS. 8A to 8H illustrate a manufacturing process in which a gate semiconductor layer 270 is first formed in a shape of a sidewall SW having a plurality of surfaces SW having different slopes, and then a gate electrode GA is formed.

Figure 8A:
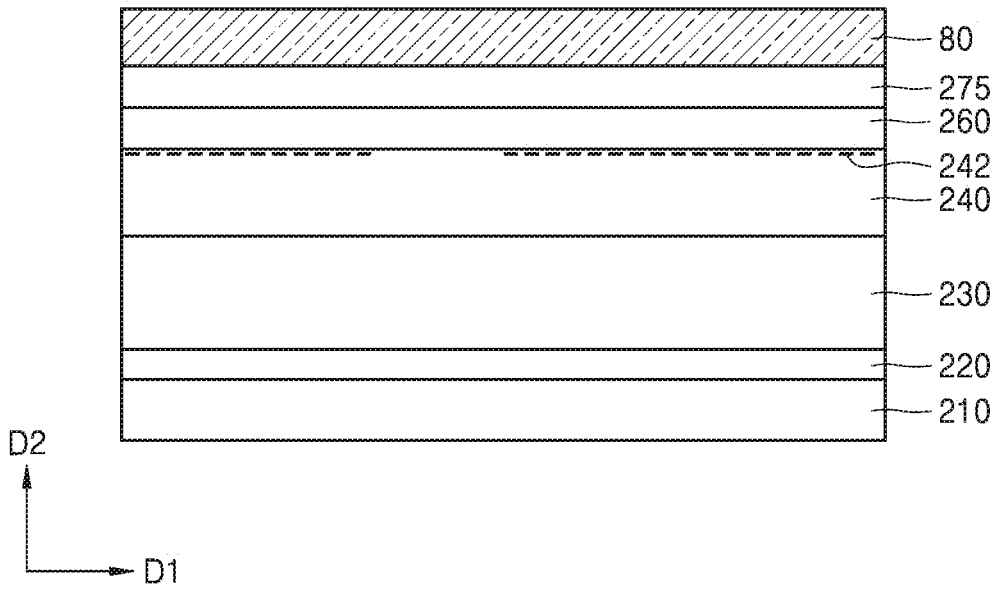
FIGS. 8A to 8H are diagrams illustrating a method of manufacturing a semiconductor device according to an embodiment.

Referring to FIG. 8A, a channel layer 240, a barrier layer 260, and a gate semiconductor layer 275 are sequentially formed on a substrate 210. A seed layer 220 and a buffer layer 230 may be formed between the substrate 210 and the channel layer 240.

A photoresist layer 80 may be formed on the gate semiconductor layer 275. The photoresist layer 80 may be patterned to have a width corresponding to a desired and/or alternatively predetermined width with respect to an upper surface of the gate semiconductor layer 270.

Figure 8B:
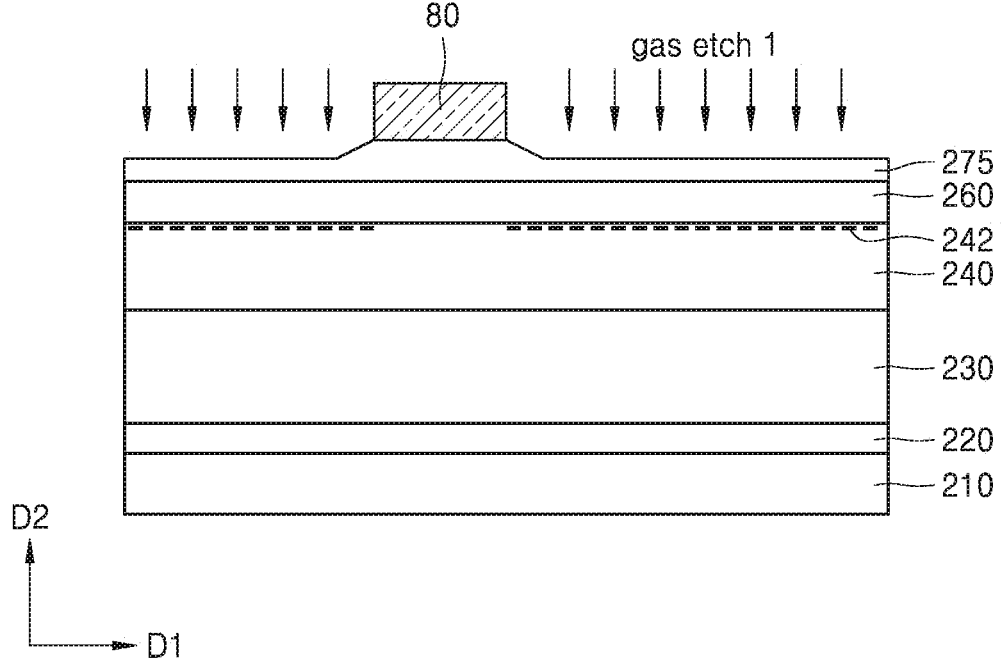
Figure 8C:
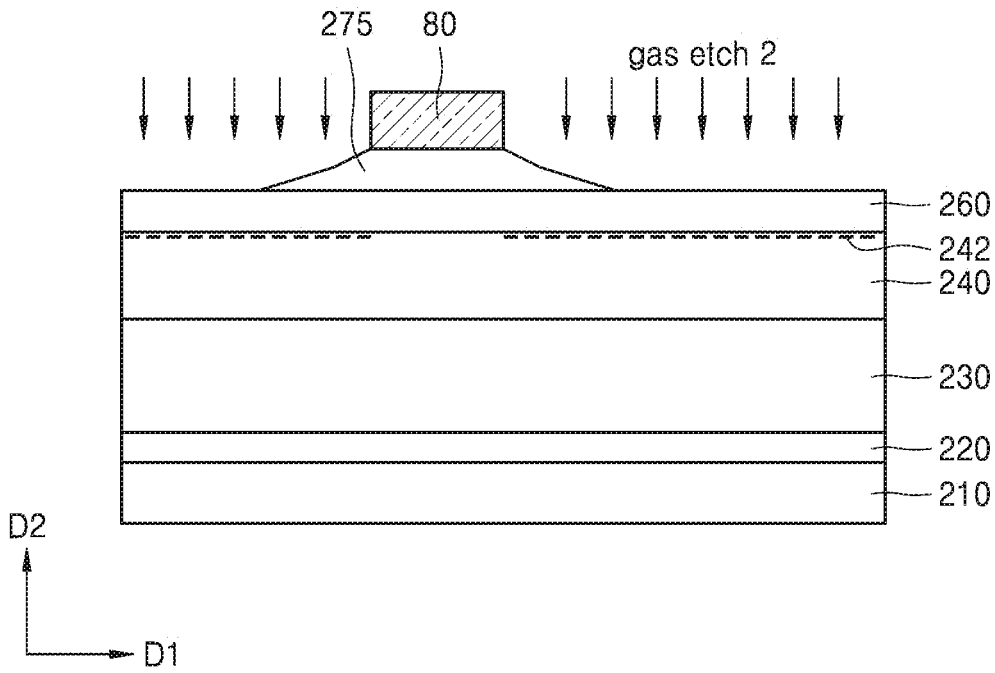

FIGS. 8B and 8C illustrate processes of performing dry etching the gate semiconductor layer 270 over primary and secondary processes. The processes of FIGS. 8B and 8C are different from the processes of FIGS. 7C and 7D in that the patterned photoresist layer 80 is used as an etching mask, and the remaining processes are substantially the same.

Figure 8D:
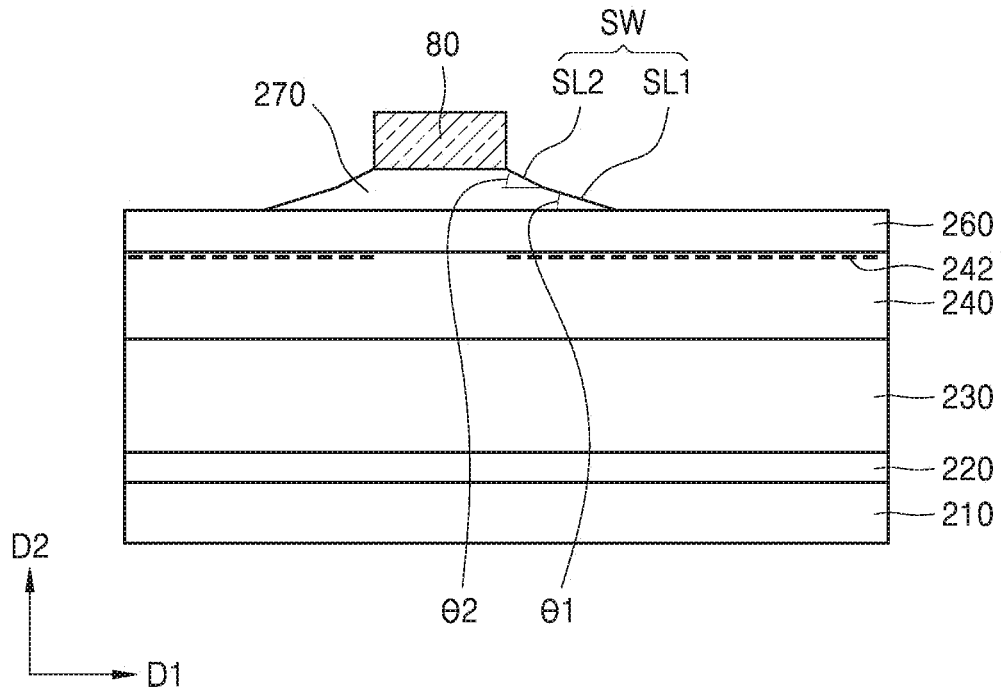
Figure 8E:
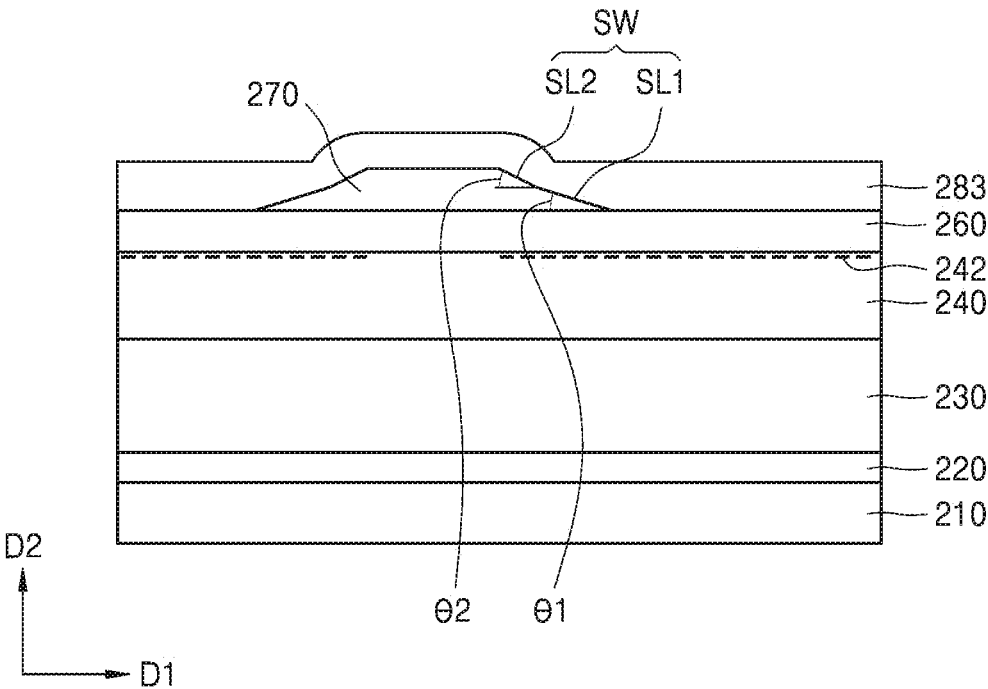

Through this process, as illustrated in FIG. 8D, a gate semiconductor layer 270 is formed in a shape having a sidewall SW including a first inclined surface SL1 having an inclination angle θ1 and a second inclined surface SL2 having an inclination angle θ2 greater than θ1.

Next, the photoresist layer 80 is removed, and as shown in FIG. 8D, a passivation layer 283 is formed on the gate semiconductor layer 270.

Figure 8F:
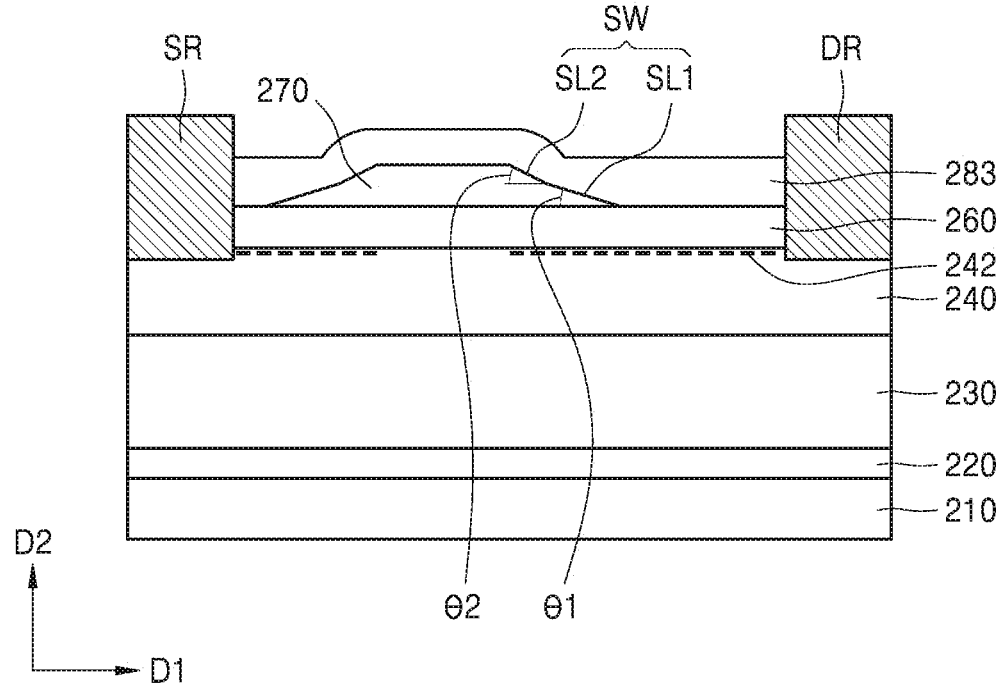

Referring to FIG. 8F, a source SR and a drain DR are formed to pass through the passivation layer 283 and contact the channel layer 240.

Figure 8G:
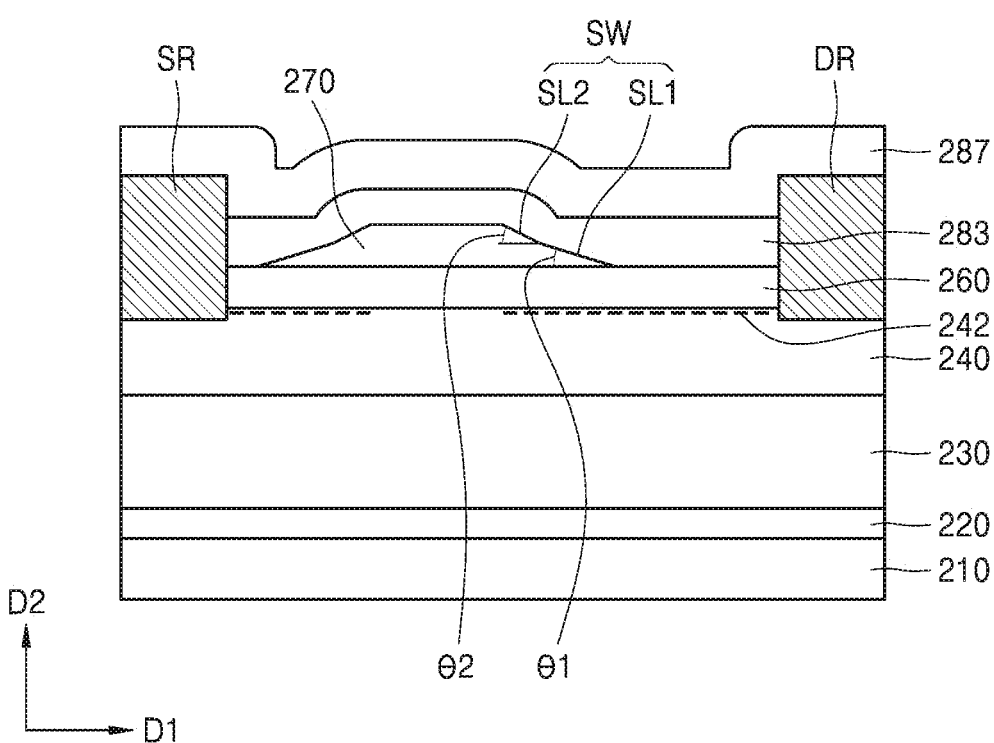
Figure 8H:
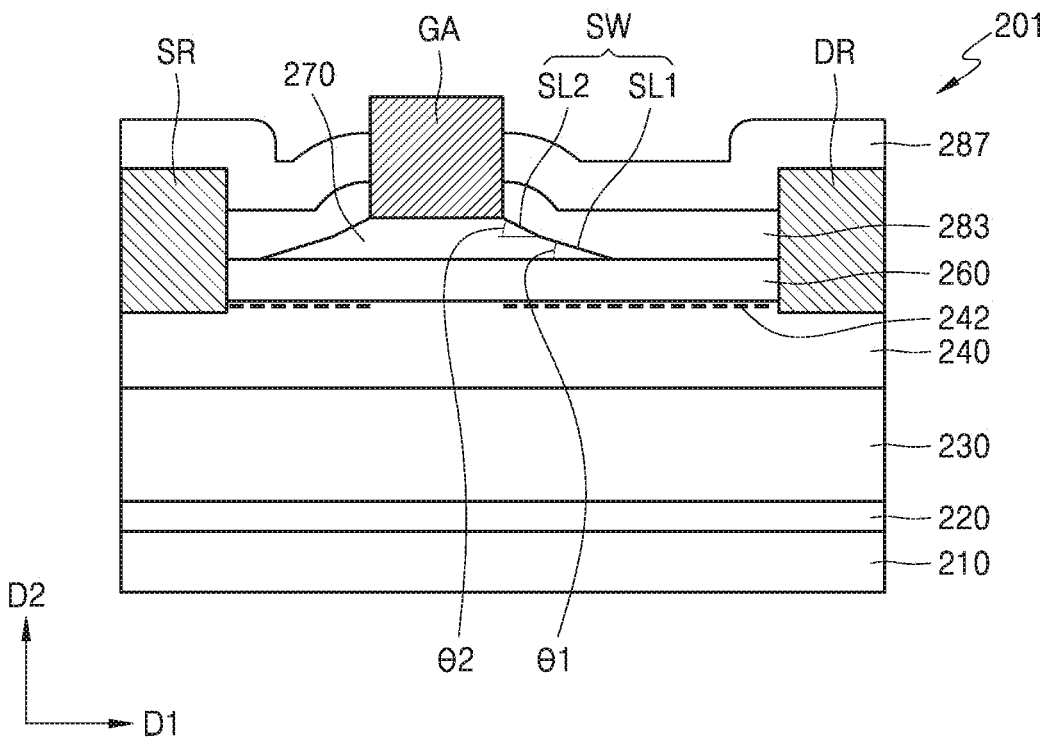

Referring to FIG. 8G, a passivation layer 287 is formed to cover the source SR and the drain DR, and as shown in FIG. 8H, a gate electrode GA is formed to penetrate the passivation layer 287 and contact the gate semiconductor layer 270.

The semiconductor device 201 manufactured as described above may be substantially the same as the semiconductor device 200 manufactured by the processes of FIGS. 7A to 7G, and may be substantially the same as the semiconductor device 100 described in FIGS. 1A and 1B. In addition, the shape of the illustrated gate semiconductor layer 270 may be changed to the gate semiconductor layer 171, 172, 173, or 174 described in FIGS. 2 to 5 or a combination thereof.

Figure 9A:
FIGS. 9A and 9B are photomicrographs showing a shape of a sidewall of a gate semiconductor layer of a semiconductor device manufactured according to a method of manufacturing a semiconductor device according to an embodiment.
Figure 9B:

FIGS. 9A and 9B are photomicrographs showing in detail the sidewall shape of p-GaN, a gate semiconductor layer manufactured according to a manufacturing process according to an embodiment, that is, a primary etching process and a secondary etching process using different gas atmospheres. Through the manufacturing process described above, it may be seen that the desired sidewall shape is well implemented.

In example embodiments, the semiconductor devices described above may have a reduced gate leakage current.

In example embodiments, the semiconductor devices described above may be used as a HEMT device with improved efficiency. Additionally, in example embodiments, the semiconductor devices described above may be applied to various electronic systems and/or devices.

Figure 10:
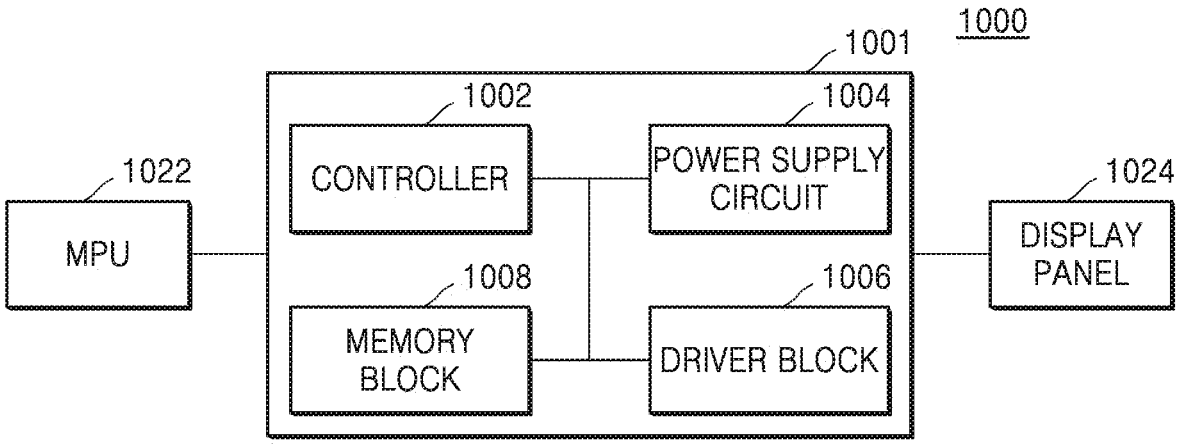
FIG. 10 illustrates a block diagram of an electronic system including a power supply circuit according to an example embodiment.

As an example, FIG. 10 illustrates a block diagram of an electronic system including a power supply circuit according to an example embodiment.

Referring to FIG. 10, the electronic system 1000 may include an integrated circuit (IC) 1001, such as a display-driver integrated circuit (DDI), and the IC may include a controller 1002, a power supply circuit 1004, a driver block 1006, and a memory block 1008. The controller 1002 receives and decodes a command applied from a main processor (MPU) 1022, and controls each block of the IC 1001 to implement an operation according to the command. The power supply circuit 1004 generates a driving voltage in response to the control of the controller 1002. The driver block 1006 drives a display apparatus 1024 using the driving voltage generated by the power supply circuit unit 1004 in response to the control of the controller 1002. The display apparatus 1024 may be a LED display, LCD display, or plasma display, but is not limited thereto. The memory block 1008 is a block for temporarily storing commands input to the controller 1002 or control signals output from the controller 1002 or for storing necessary data, and may include a memory (e.g., DRAM, Flash Memory). The power supply circuit 1004 and/or display panel 1024 may include a semiconductor device according to any one of the example embodiments described in FIGS. 1A, 1B, and 2-5.

15 16

Figure 11:
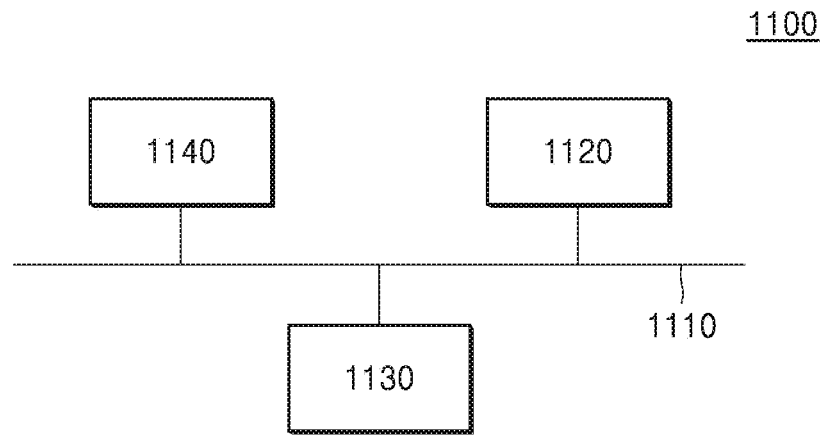
FIG. 11 is a block diagram of an electronic device including a power device according to an example embodiment.

As another example, FIG. 11 is a block diagram of an electronic device including a power device according to an example embodiment.

As shown in FIG. 11, the electronic device 1100 includes one or more electronic device components, including a processor (e.g., processing circuitry) 1120 and a memory 1130 that are communicatively coupled together via a bus 1110.

The processing circuitry 1120 may include, and/or may be implemented by, one or more instances of processing circuitry such as hardware including logic circuits, a hardware/ software combination such as a processor executing software; or a combination thereof.

In some example embodiments, the electronic device 1100 may include one or more additional components (not shown) coupled to the bus 1110, which may include, for example, a power supply, a light sensor, a light-emitting device, any combination thereof, or the like. In some example embodiments, one or more of the processing circuitry 1120, memory 1130, or one or more additional components may include a semiconductor device according to any one of the example embodiments described in FIGS. 1A, 1B, and 2-5.

According to the manufacturing method described above, a semiconductor device including a gate semiconductor layer having a plurality of surfaces having different slopes may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a channel layer;
a barrier layer on the channel layer, an energy band gap of the barrier layer being greater than an energy band gap of the channel layer;
a gate electrode on the barrier layer;
a gate semiconductor layer between the barrier layer and the gate electrode; and
a source and a drain on the channel layer and spaced apart from each other, wherein
the gate semiconductor layer includes a first surface contacting the barrier layer, a second surface contacting the gate electrode and a first sidewall connecting the first surface with the second surface and a second sidewall opposite the first sidewall,
an area of the second surface of the gate semiconductor layer is narrower than an area of the first surface of the gate semiconductor layer, and
the first sidewall and the second sidewall of the gate semiconductor layer each includes a plurality of surfaces having different slopes,
wherein the plurality of surfaces includes a first inclined surface contacting the barrier layer and a second inclined surface extending between the second surface and the first inclined surface and contacting the gate electrode, the second inclined surface being nonparallel with the second surface and an angle between the first inclined surface and the first surface is less than an angle between the second inclined surface and the second surface.

2. The semiconductor device of claim 1, wherein
the first inclined surface contacts the first surface of the gate semiconductor layer at a first angle, and
the second inclined surface contacts the second surface of the gate semiconductor layer at a second angle, and
the first angle is less than the second angle.

3. The semiconductor device of claim 2, wherein the first angle is about 40° or less.

4. The semiconductor device of claim 2, wherein the second angle is greater than or equal to about 60° and less than or equal to about 90°.

5. The semiconductor device of claim 1, wherein
angles formed by the plurality of surfaces and the first surface decrease as positions of the plurality of surfaces approach the first surface.

6. The semiconductor device of claim 1, wherein
the first surface of the gate semiconductor layer and the second surface of the gate semiconductor layer are apart from each other in a height direction, and in the height direction, a height of the first sidewall of the gate semiconductor layer is greater than or equal to about 2 nm and less than or equal to about 200 nm.

7. The semiconductor device of claim 1, wherein
the first surface of the gate semiconductor layer and the second surface of the gate semiconductor layer are apart from each other in a height direction, and
in the height direction, a height of each of the plurality of surfaces is greater than or equal to about 1 nm and less than or equal to about 100 nm.

8. The semiconductor device of claim 1, wherein at least one of the plurality of surfaces comprises a curved surface.

9. The semiconductor device of claim 1, wherein the plurality of surfaces form a concave curved surface.

10. The semiconductor device of claim 1, wherein the channel layer comprises a group III-V compound semiconductor.

11. The semiconductor device of claim 1, wherein the gate semiconductor layer comprises p-type GaN.

12. The semiconductor device of claim 1, wherein
the semiconductor device comprises a high electron mobility transistor (HEMT) having a normally off property.

13. A method of manufacturing a semiconductor device, the method comprising:
sequentially forming a channel layer, a barrier layer, and a gate semiconductor layer on a substrate;
etching the gate semiconductor layer to have a shape in which an area of a first surface of the gate semiconductor layer is wider than an area of a second surface of the gate semiconductor layer, the first surface of the gate semiconductor layer being in contact with the barrier layer, the second surface of the gate semiconductor layer being opposite the first surface of the gate semiconductor layer, the gate semiconductor layer including a first sidewall connecting the first surface of the gate semiconductor layer to the second surface of the gate semiconductor layer and a second sidewall opposite the first sidewall connecting the first surface of the gate semiconductor layer to the second surface of the gate semiconductor layer,
the etching the gate semiconductor layer including forming a plurality of surfaces having different slopes in each of the first sidewall and the second sidewall of the gate semiconductor layer;

forming a gate electrode on the gate semiconductor layer; and forming a source and a drain in contact with a first side of the channel layer and a second side of the channel layer, respectively, wherein the plurality of surfaces includes a first inclined surface contacting the barrier layer and a second inclined surface extending between the second surface and the first inclined surface and contacting the gate electrode, the second inclined surface being nonparallel with the second surface and an angle between the first inclined surface and the first surface is less than an angle between the second inclined surface and the second surface.

14. The method of claim 13, wherein, in the etching the gate semiconductor layer, an angle formed by each of the plurality of surfaces and the first surface decreases as positions of the plurality of surfaces approach the first surface.

15. The method of claim 13, wherein the first inclined surface contacts the first surface of the gate semiconductor layer at a first angle, and the second inclined surface contacts the second surface of the gate semiconductor layer at a second angle, and the first angle is less than the second angle.

16. The method of claim 15, wherein the etching the gate semiconductor layer comprises:

forming the second inclined surface using a first gas; and forming the first inclined surface using a second gas, the second gas being different from the first gas.

17. The method of claim 13, wherein the etching the gate semiconductor layer is performed after the forming the gate electrode.

18. The method of claim 13, wherein the forming the gate electrode is performed after the etching the gate semiconductor layer.

19. The method of claim 13, wherein a material of the barrier layer has a greater energy band gap than an energy band gap of a material of the channel layer.

20. The semiconductor device of claim 1, wherein the source and the drain are in ohmic contact with the channel layer.

* * * * *